US012615924B2

(12) United States Patent
Lu et al.

(10) Patent No.: US 12,615,924 B2
(45) Date of Patent: Apr. 28, 2026

(54) DISPLAY PANEL, METHOD FOR MANUFACTURING SAME, AND DISPLAY DEVICE

(71) Applicant: BOE TECHNOLOGY GROUP CO., LTD., Beijing (CN)

(72) Inventors: Jiangnan Lu, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 935 days.

(21) Appl. No.: 17/779,741

(22) PCT Filed: Mar. 5, 2021

(86) PCT No.: PCT/CN2021/079364
§ 371 (c)(1),
(2) Date: May 25, 2022

(87) PCT Pub. No.: WO2022/183498
PCT Pub. Date: Sep. 9, 2022

(65) Prior Publication Data
US 2023/0180540 A1     Jun. 8, 2023

(51) Int. Cl.
| | |
|---|---|
| *H10K 59/124* | (2023.01) |
| *H10K 59/12* | (2023.01) |
| *H10K 59/123* | (2023.01) |
| *H10K 59/35* | (2023.01) |
(Continued)

(52) U.S. Cl.
CPC ....... *H10K 59/124* (2023.02); *H10K 59/1201* (2023.02); *H10K 59/123* (2023.02); *H10K 59/35* (2023.02); *H10K 59/80515* (2023.02); *H10K 2102/311* (2023.02); *H10K 2102/351* (2023.02)

(58) Field of Classification Search
CPC ............ H10K 59/124; H10K 59/1201; H10K 59/123; H10K 59/35; H10K 59/80515; H10K 2102/311; H10K 2102/351; H10K 50/813
See application file for complete search history.

(56) References Cited

U.S. PATENT DOCUMENTS

| | | |
|---|---|---|
| 2009/0039773 A1 | 2/2009 | Jun et al. |
| 2015/0001477 A1 | 1/2015 | Namkung |
| 2017/0287997 A1* | 10/2017 | Park ................ H10K 59/80515 |

(Continued)

FOREIGN PATENT DOCUMENTS

| | | |
|---|---|---|
| CN | 103000823 A | 3/2013 |
| CN | 104282721 A | 1/2015 |

(Continued)

*Primary Examiner* — Britt Hanley
*Assistant Examiner* — Victor V Barzykin
(74) *Attorney, Agent, or Firm* — Lippes Mathias LLP

(57) ABSTRACT

Provided is a display panel. The display panel includes a base substrate, provided with a curved display region and a planar display region, wherein the curved display region is configured for curved display; and a plurality of first sub-pixels disposed in the curved display region and a plurality of second sub-pixels disposed in the planar display region, wherein each of the first sub-pixels and the second sub-pixels includes: a planarization layer, an electrode pattern, a light-emitting pattern, and an electrode layer which are sequentially laminated in a direction going away from the base substrate.

19 Claims, 17 Drawing Sheets

(51) Int. Cl.
    *H10K 59/80*       (2023.01)
    *H10K 102/00*     (2023.01)

(56)             References Cited

U.S. PATENT DOCUMENTS

| | | | |
|---|---|---|---|
| 2018/0076270 A1* | 3/2018 | Kwon | .................. H10K 59/352 |
| 2019/0181365 A1 | 6/2019 | Choi | |
| 2021/0210515 A1 | 7/2021 | Zhang et al. | |

FOREIGN PATENT DOCUMENTS

| | | |
|---|---|---|
| CN | 107146809 A | 9/2017 |
| CN | 107819010 A | 3/2018 |
| CN | 108346685 A | 7/2018 |
| CN | 110010646 A | 7/2019 |
| CN | 110828535 A | 2/2020 |

* cited by examiner

101

101b c1     c2

101a 102a     102b a4
a3
a2
d3  d1          d2     a1
101

A

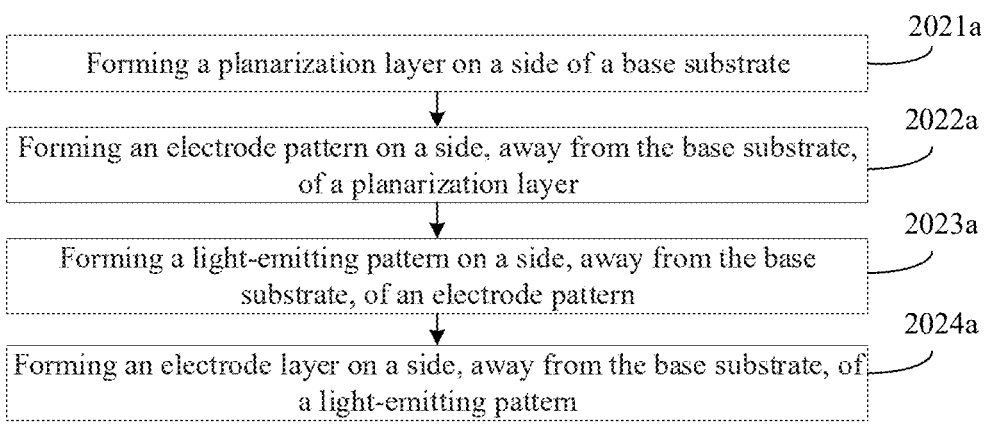

Forming a planarization layer on a side of a base substrate — 2021a

Forming an electrode pattern on a side, away from the base substrate, of a planarization layer — 2022a Forming a light-emitting pattern on a side, away from the base substrate, of an electrode pattern — 2023a Forming an electrode layer on a side, away from the base substrate, of a light-emitting pattern — 2024a

FIG. 19

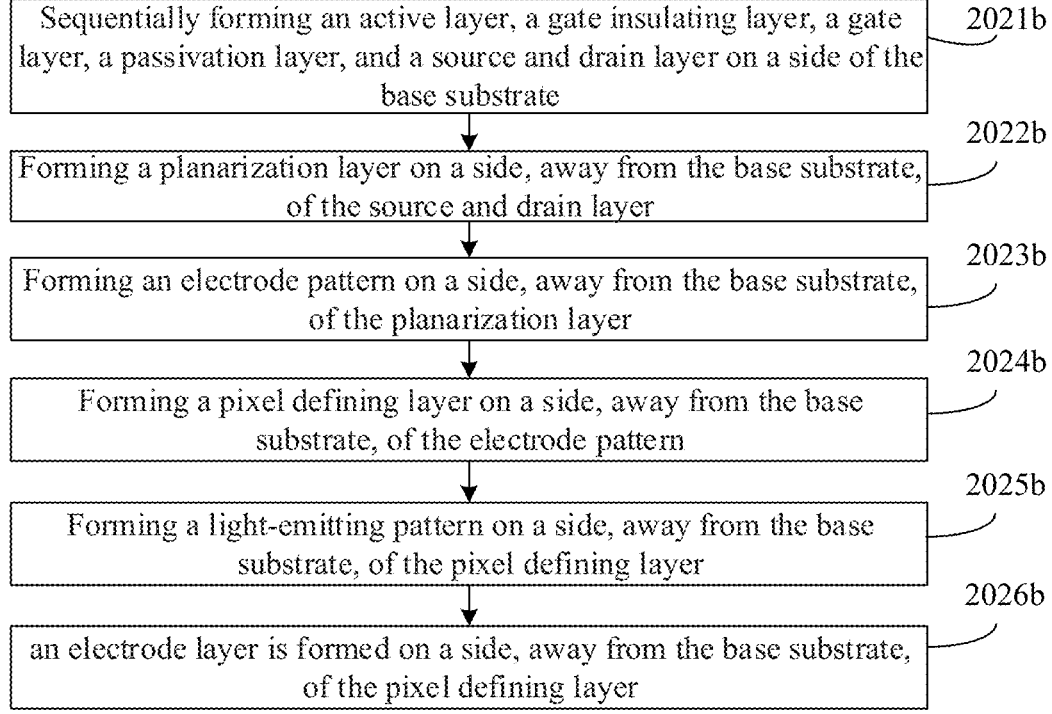

Sequentially forming an active layer, a gate insulating layer, a gate layer, a passivation layer, and a source and drain layer on a side of the base substrate — 2021b Forming a planarization layer on a side, away from the base substrate, of the source and drain layer — 2022b Forming an electrode pattern on a side, away from the base substrate, of the planarization layer — 2023b Forming a pixel defining layer on a side, away from the base substrate, of the electrode pattern — 2024b Forming a light-emitting pattern on a side, away from the base substrate, of the pixel defining layer — 2025b an electrode layer is formed on a side, away from the base substrate, of the pixel defining layer — 2026b

FIG. 20

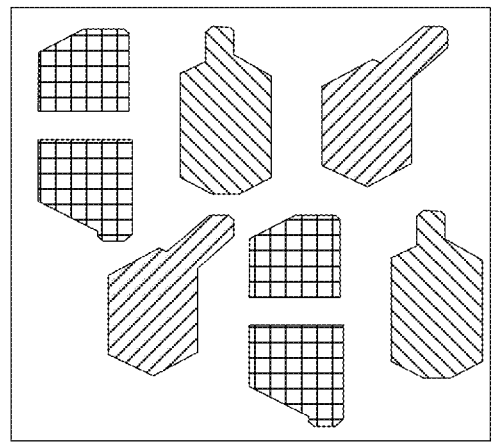
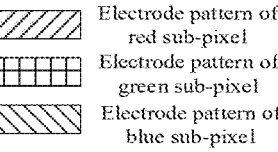
Electrode pattern of
red sub-pixel
Electrode pattern of
green sub-pixel
Electrode pattern of
blue sub-pixel
FIG. 30
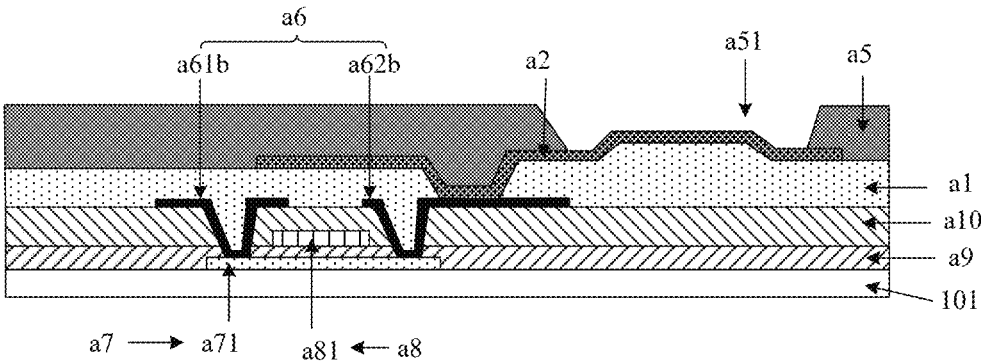
FIG. 31 a51

W

Z a51

DISPLAY PANEL, METHOD FOR MANUFACTURING SAME, AND DISPLAY DEVICE

CROSS-REFERENCE TO RELATED APPLICATION

This application is a 371 of PCT application No. PCT/CN2021/079364, filed on Mar. 5, 2021, the content of which is incorporated herein by reference in its entirety.

TECHNICAL FIELD

The present disclosure relates to the field of display technologies, and in particular relates to a display panel, a method for manufacturing the same, and a display device.

BACKGROUND

With the development of science and technology, flexible display panels have been widely used in curved display devices for the good bending performance.

SUMMARY

The present disclosure provides a display panel, a method for manufacturing the same, and a display device.

In an aspect, a display panel is provided. The display panel includes:

a base substrate, provided with a curved display region and a planar display region, wherein the curved display region is configured for curved display; and a plurality of first sub-pixels disposed in the curved display region and a plurality of second sub-pixels disposed in the planar display region, wherein each of the first sub-pixels and the second sub-pixels includes: a planarization layer, an electrode pattern, a light-emitting pattern, and an electrode layer which are sequentially laminated in a direction going away from the base substrate; wherein the plurality of first sub-pixels includes at least one first target sub-pixel and at least one second target sub-pixel, wherein the planarization layer of the first target sub-pixel is provided with a protruding structure, and a maximum distance between a side, away from the base substrate, of the planarization layer of the second target sub-pixel and a side, close to the base substrate, of the planarization layer of the second target sub-pixel is smaller than a maximum distance between a side, away from the base substrate, of the planarization layer of the first target sub-pixel and a side, close to the base substrate, of the planarization layer of the first target sub-pixel;

wherein for the first target sub-pixel, an orthographic projection of a portion, in contact with both the electrode pattern and the electrode layer, of the light-emitting pattern of the first target sub-pixel on the base substrate covers an orthographic projection of the protruding structure in the planarization layer of the first target sub-pixel on the base substrate.

Optionally, wherein a color of light emitted from the at least one first target sub-pixel is different from a color of light emitted from the at least one second target sub-pixel; and the at least one first target sub-pixel includes a blue sub-pixel, and the at least one second target sub-pixel includes at least one of a red sub-pixel and a green sub-pixel.

Optionally, the at least one first target sub-pixel includes a blue sub-pixel, a red sub-pixel, and a green sub-pixel; and the protruding structure in the planarization layer of each first target sub-pixel is provided with a central region and a peripheral region;

wherein in a first plane perpendicular to a bearing surface of the base substrate, a first angle between a tangent line of the peripheral region of the protruding structure in the blue sub-pixel and a side, close to the base substrate, of the protruding structure is greater than or equal to a second angle between a tangent line of the peripheral region of the protruding structure in the red sub-pixel and a side, close to the base substrate, of the protruding structure.

Optionally, the first angle is greater than or equal to a third angle between a tangent line of the peripheral region of the protruding structure in the green sub-pixel and a side, close to the base substrate, of the protruding structure.

Optionally, the first angle is greater than or equal to 5° and smaller than or equal to 40°.

Optionally, the second angle and the third angle are both greater than or equal to 0° and smaller than or equal to 40°.

Optionally, the first angle ranges from 8° to 12°.

Optionally, each of the sub-pixels further includes a pixel defining layer disposed on a side, away from the base substrate, of the electrode pattern, the pixel defining layer being provided with an opening, at least a portion of the light-emitting pattern of the sub-pixel being disposed in the opening; wherein a slope angle of the opening in the pixel defining layer of each first target sub-pixel is smaller than a slope angle of the opening in the pixel defining layer of any second target sub-pixel;

wherein the slope angle of the opening in the pixel defining layer is an angle between a side face of the opening in the pixel defining layer and a side, close to the base substrate, of the pixel defining layer.

Optionally, the slope angle of the opening in the pixel defining layer of the blue sub-pixel in the display panel is smaller than the slope angle of the opening in the pixel defining layer of the red sub-pixel in the display panel, and smaller than the slope angle of the opening in the pixel defining layer of the green sub-pixel in the display panel.

Optionally, the protruding structure in each first target sub-pixel includes a first protruding sub-structure and a second protruding sub-structure which are arranged in a first direction; wherein a length of the first protruding sub-structure in a second direction is greater than a length of the first protruding sub-structure in a first direction; and a length of the second protruding sub-structure in the second direction is greater than a length of the second protruding sub-structure in the first direction, wherein the second direction is approximately perpendicular to the first direction, and the first direction and the second direction are both approximately parallel to a bearing surface of the base substrate.

Optionally, the length of the first protruding sub-structure in the first direction is approximately equal to the length of the second protruding sub-structure in the first direction, and the length of the first protruding sub-structure in the second direction is approximately equal to the length of the second protruding sub-structure in the second direction.

Optionally, a light-emitting region of each first target sub-pixel includes a symmetry axis extending in the second direction; wherein an orthographic projection of the first protruding sub-structure on the base substrate and an orthographic projection of the second protruding sub-structure on the base substrate are approximately symmetric about an orthographic projection of the symmetry axis on the base substrate.

Optionally, each of the sub-pixels further includes a source and drain layer disposed on a side, close to the base substrate, of the planarization layer, the source and drain layer including a source and drain metal pattern; wherein an orthographic projection of the protruding structure in each first target sub-pixel on the base substrate is at least partially overlapped with an orthographic projection of the source and drain metal pattern on the base substrate.

Optionally, the source and drain metal pattern includes a first pattern and a second pattern; wherein a length of the first pattern in a second direction is greater than a length of the first pattern in a first direction; and a length of the second pattern in the second direction is greater than a length of the second pattern in the first direction; wherein the second direction is approximately perpendicular to the first direction, and both the first direction and the second direction are approximately parallel to a bearing surface of the base substrate; and for the electrode pattern in each first target sub-pixel, a length of the electrode pattern in the second direction is greater than a length of the electrode pattern in the first direction, and the electrode pattern includes a first edge portion and a second edge portion that are arranged in the first direction, wherein an orthographic projection of the first edge portion on the base substrate is overlapped with an orthographic projection of the first pattern on the base substrate; and an orthographic projection of the second edge portion on the base substrate is overlapped with an orthographic projection of the second pattern on the base substrate.

Optionally, a ratio of a maximum size of the protruding structure in each first target sub-pixel in a second plane to a maximum size of the protruding structure in a direction perpendicular to a bearing surface of the base substrate is greater than or equal to 5 and smaller than or equal to 20; wherein the second plane is approximately parallel to the bearing surface.

Optionally, the plurality of second sub-pixels include at least one third target sub-pixel and at least one fourth target sub-pixel; wherein the planarization layer of the third target sub-pixel is provided with a protruding structure; and a maximum distance between a side, away from the base substrate, of the planarization layer of the fourth target sub-pixel and a side, close to the base substrate, of the planarization layer of the fourth target sub-pixel is smaller than a maximum distance between a side, away from the base substrate, of the planarization layer of the third target sub-pixel and a side, close to the base substrate, of the planarization layer of the third target sub-pixel.

Optionally, a maximum size of the protruding structure of each third target sub-pixel in a direction perpendicular to a bearing surface of the base substrate is smaller than a maximum size of the protruding structure of any first target sub-pixel in the direction perpendicular to the bearing surface.

Optionally, the planarization layer of each of the sub-pixels is provided with a via hole; wherein for each first target sub-pixel, an orthographic projection of the via hole on the base substrate is separate from the orthographic projection of the protruding structure on the base substrate.

In another aspect, a method for manufacturing a display panel is provided. The method includes:

forming a plurality of first sub-pixels in a curved display region of a base substrate, and forming a plurality of second sub-pixels in a planar display region of the base substrate, the curved display region being configured for curved display;

wherein forming the first sub-pixels and the second sub-pixels respectively includes: sequentially forming a planarization layer, an electrode pattern, a light-emitting pattern, and an electrode layer in a direction going away from the base substrate; wherein the plurality of first sub-pixels includes at least one first target sub-pixel and at least one second target sub-pixel, wherein the planarization layer of the first target sub-pixel is provided with a protruding structure, and a maximum distance between a side, away from the base substrate, of the planarization layer of the second target sub-pixel and a side, close to the base substrate, of the planarization layer of the second target sub-pixel is smaller than a maximum distance between a side, away from the base substrate, of the planarization layer of the first target sub-pixel and a side, close to the base substrate, of the planarization layer of the first target sub-pixel;

wherein for the first target sub-pixel, an orthographic projection of a portion, in contact with both the electrode pattern and the electrode layer, of the light-emitting pattern of the first target sub-pixel on the base substrate covers an orthographic projection of the protruding structure in the planarization layer of the first target sub-pixel on the base substrate.

Optionally, forming the planarization layer of the first target sub-pixel on a side of the base substrate includes:

forming a planarization film layer on the side of the base substrate;

coating photoresist;

exposing the photoresist by using a halftone mask;

performing development on the photoresist; and acquiring the planarization layer by etching the planarization film layer;

wherein light transmittance of a portion, corresponding to a portion with the protruding structure of the planarization layer, of the halftone mask is different from light transmittance of a portion, corresponding to a portion other than the protruding structure of the planarization layer, of the halftone mask.

Optionally, a color of light emitted from the at least one first target sub-pixel is different from a color of light emitted from the at least one second target sub-pixel; and the at least one first target sub-pixel includes a blue sub-pixel, and the at least one second target sub-pixel includes at least one of a red sub-pixel and a green sub-pixel.

In still another aspect, a display device is provided. The display device includes a power supply assembly and the display panel described in the above aspect.

The power supply assembly is configured to supply power to the display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 19 is a flowchart of forming a planarization layer according to an embodiment of the present application;

FIG. 20 is another flowchart of forming a planarization layer according to an embodiment of the present application;

FIG. 30 is a top view of electrode patterns of a plurality of sub-pixels according to an embodiment of the present disclosure;

FIG. 31 is a schematic diagram of formation of pixel defining layers of a plurality of sub-pixels according to an embodiment of the present disclosure;

DETAILED DESCRIPTION

For clearer descriptions of the objectives, technical solutions, and advantages of the present disclosure, the embodiments of the present disclosure are described in detail hereinafter with reference to the accompanying drawings.

In the related art, a curved display device includes a curved cover plate and a flexible display panel attached to the curved cover plate. The curved cover plate may be a cover plate whose edge is bent inwards. The flexible display panel may be attached to an inner side of the curved cover plate, and the edge of the flexible display panel is also bent inwards after the flexible display panel is attached to the curved cover plate. Both the front face and the side face of the curved display device consisting of the curved cover plate and the flexible display panel can be used to display images. The side face of the curved display device consists of the bending edge of the curved cover plate and the bending edge of the flexible display panel.

However, because light emitted from sub-pixels at the bending edge of the flexible display panel cannot be emitted out, the color shift occurs to images displayed on the side face of the curved display device, resulting in a relatively poor display effect of the curved display device.

Figure 1:
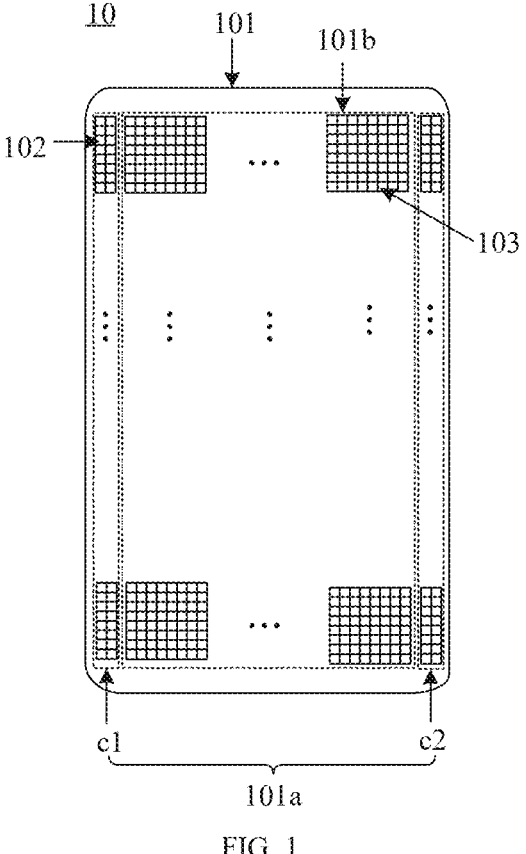
FIG. 1 is a schematic structural diagram of a display panel according to an embodiment of the present disclosure.
Figure 2:
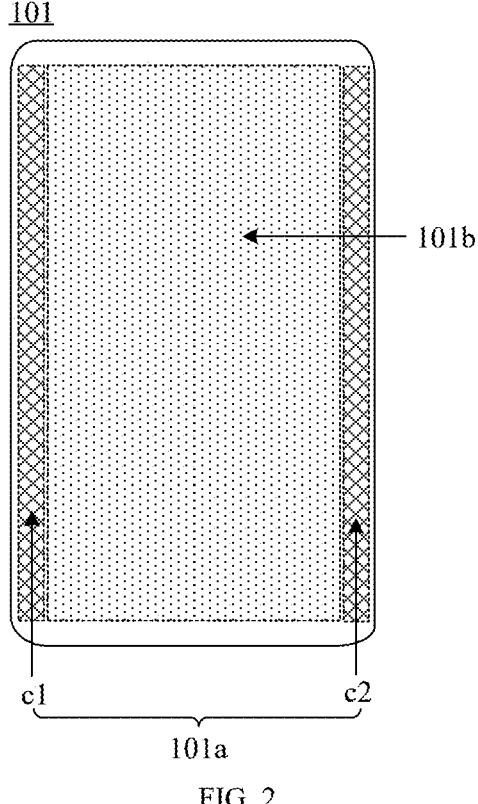
FIG. 2 is a top view of a base substrate according to an embodiment of the present disclosure.

FIG. 1 is a schematic structural diagram of a display panel according to an embodiment of the present disclosure. Referring to FIG. 1, it can be known that the display panel 10 may include a base substrate 101, a plurality of first sub-pixels 102, and a plurality of second sub-pixels 103. FIG. 2 is a top view of a base substrate according to an embodiment of the present disclosure. With reference to FIG. 1 and FIG. 2, the base substrate 101 may include a curved display region 101a and a planar display region 101b. The curved display region 101a may be configured for curved display. The curved display region 101a in FIG. 2 includes two sub-regions (c1 and c2). The two sub-regions (c1 and c2) may be regions on the left and right edges of the base substrate 101 respectively, and may be disposed on two sides of the planar display region 101b respectively.

Referring to FIG. 1, the plurality of first sub-pixels 102 may be disposed in the curved display region 101a, and the plurality of second sub-pixels 103 may be disposed in the planar display region 101b. The number of the first sub-pixels 102 and second sub-pixels 103 shown in FIG. 1 does not represent the actual number of the sub-pixels in the display panel, and is merely used to illustrate positions of the plurality of first sub-pixels 102 and the plurality of second sub-pixels 103.

Figure 3:
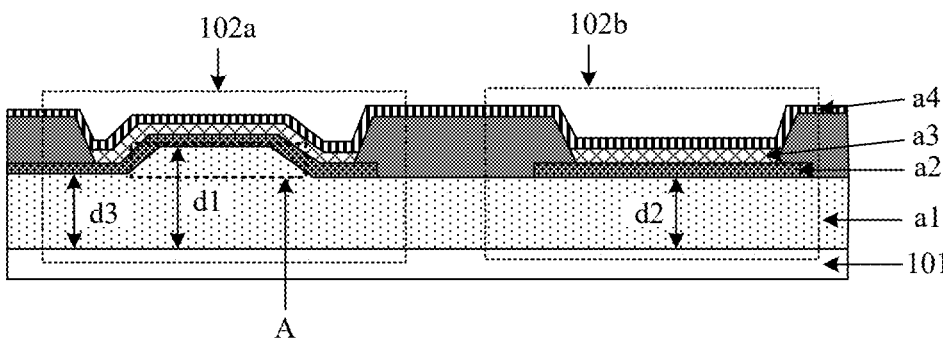
FIG. 3 is a schematic diagram of a base substrate and sub-pixels according to an embodiment of the present disclosure.

FIG. 3 is a schematic diagram of a base substrate and sub-pixels according to an embodiment of the present disclosure. The sub-pixel shown in FIG. 3 may be a first sub-pixel 102 or a second sub-pixel 103.

Referring to FIG. 3, the first sub-pixel 102 and the second sub-pixel 103 may each include a planarization layer (PLN) a1, an electrode pattern a2, a light-emitting pattern a3, and an electrode layer a4 which are sequentially laminated in a direction going away from the base substrate 101. The sub-pixels in the display panel 10 may share one electrode layer a4, that is, the electrode layers a4 of the plurality of sub-pixels is an integral structure.

In this embodiment of the present disclosure, assuming that both the two sub-pixels shown in FIG. 3 are the first sub-pixels, referring to FIG. 3, the plurality of first sub-pixels 102 may include at least one first target sub-pixel 102a and at least one second target sub-pixel 102b. FIG. 3 schematically shows one first target sub-pixel 102a and one second target sub-pixel 102b. The planarization layer a1 of the first target sub-pixel 102a is provided with a protruding structure A. The maximum distance d2 between the side, away from the base substrate 101, of the planarization layer a1 of the second target sub-pixel 102b and the side, close to the base substrate 101, of the planarization layer a1 of the second target sub-pixel 102b is smaller than the maximum distance d1 between the side, away from the base substrate 101, of the planarization layer a1 of the first target sub-pixel 102a and the side, close to the base substrate 101, of the planarization layer a1 of the first target sub-pixel 102a.

The maximum distance d2 between the side, away from the base substrate 101, of the planarization layer a1 of the second target sub-pixel 102b and the side, close to the base substrate 101, of the planarization layer a1 of the second target sub-pixel 102b may be the maximum length of the planarization layer a1 of the second target sub-pixel 102b in the direction perpendicular to a bearing surface of the base substrate 101. The maximum distance d1 between the side, away from the base substrate 101, of the planarization layer a1 of the first target sub-pixel 102a and the side, close to the base substrate 101, of the planarization layer a1 of the first target sub-pixel 102a may be the maximum length of the planarization layer a1 of the first target sub-pixel 102a in the direction perpendicular to the bearing surface of the base substrate 101.

Optionally, the planarization layer a1 of the second target sub-pixel 102b may be not provided with a protruding structure A, such that the distance between the side, away from the base substrate 101, of the planarization layer a1 of the second target sub-pixel 102b and the side, close to the base substrate 101, of the planarization layer a1 of the second target sub-pixel 102b may be equal at all positions. In this case, the maximum length of the planarization layer a1 of the second target sub-pixel 102b in the direction perpendicular to the bearing surface of the base substrate 101 is the distance between the side, away from the base substrate 101, of the planarization layer a1 of the second target sub-pixel 102b and the side, close to the base substrate 101, of the planarization layer a1 of the second target sub-pixel 102b.

In this embodiment of the present disclosure, the distance between the side, away from the base substrate 101, of a portion other than the protruding structure A of the planarization layer a1 and the side, close to the base substrate 101, of this portion is a fixed value. Therefore, in the case that the planarization layer a1 of the second target sub-pixel 102b is not provided with the protruding structure A, the distance d3 between the side, away from the base substrate 101, of the portion other than the protruding structure A of the planarization layer a1 of the first target sub-pixel 102a and the side, close to the base substrate 101, of this portion is equal to the maximum length d2 of the planarization layer a1 of the second target sub-pixel 102b in the direction perpendicular to the bearing surface of the base substrate 101. By providing the protruding structure A in the planarization layer a1 of the first target sub-pixel 102a, the maximum length d1 of the planarization layer a1 of the first target sub-pixel 102a in the direction perpendicular to the bearing surface of the base substrate 101 is greater than the maximum length d2, in the direction perpendicular to the bearing surface of the base substrate 101, of the planarization layer a1 of the second target sub-pixel 102b.

Figure 4:
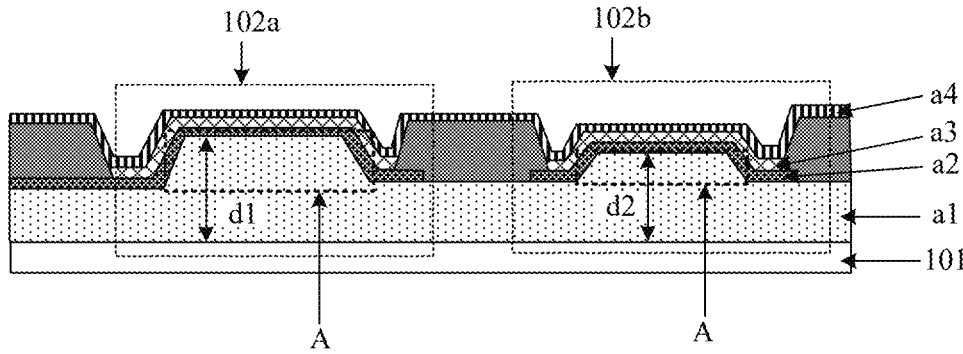
FIG. 4 is a schematic diagram of another base substrate and another sub-pixel according to an embodiment of the present disclosure.

Alternatively, referring to FIG. 4, the planarization layer a1 of the second target sub-pixel 102b may also be provided with a protruding structure A. However, the length of the protruding structure A in the planarization layer a1 of the second target sub-pixel 102b in the direction perpendicular to the bearing surface of the base substrate 101 is smaller than the length of the protruding structure A in the planarization layer a1 of the first target sub-pixel 102a in the direction perpendicular to the bearing surface of the base substrate 101, such that the maximum length d1 of the planarization layer a1 of the first target sub-pixel 102a in the direction perpendicular to the bearing surface of the base substrate 101 is greater than the maximum length d2 of the planarization layer a1 of the second target sub-pixel 102b in the direction perpendicular to the bearing surface of the base substrate 101.

In this embodiment of the present disclosure, the curved display region 101a of the base substrate 101 may form a bending portion of the display panel. Because the first target sub-pixel 102a in the first sub-pixel 102 disposed in the curved display region 101a is provided with a protruding structure A, light emitted from the bending portion of the display panel 10 can be emitted normally, which ensures the display effect of the display device. In addition, the planar display region 101b of the base substrate 101 may form a non-bending portion of the display panel. Generally, as light emitted from the non-bending portion of the display panel can be emitted normally, angle adjustment does not need to be performed on the light emitted from the non-bending portion of the display panel. Therefore, the planarization layer a1 of the second sub-pixel 103 disposed in the planar display region 101b may be not provided with the protruding structure A. Certainly, the planarization layer a1 of the second sub-pixel 103 may also be provided with the protruding structure A, which is not limited in the embodiments of the present disclosure.

Referring to FIG. 3 and FIG. 4, for the first target sub-pixel 102a, an orthographic projection of the portion, in contact with both the electrode pattern a2 and the electrode layer a4, of the light-emitting pattern a3 of the first target sub-pixel 102a, on the base substrate 101 covers an orthographic projection of the protruding structure A in the planarization layer a1 of the first target sub-pixel 102a on the base substrate 101. That is, the side, away from the base substrate 101, of the protruding structure A is totally in contact with the side, close to the base substrate 101, of the electrode pattern a2 of the first target sub-pixel 102a. Alternatively, it may be understood that the portion, in contact with the electrode pattern a2, of the protruding structure A is an entire side, away from the base substrate 101, of the protruding structure A.

In this embodiment of the present disclosure, the side, close to the base substrate 101, of the light-emitting pattern a3 of each sub-pixel may be in contact with the side, away from the base substrate 101, of the electrode pattern a2 of the sub-pixel. In addition, the side, away from the base substrate 101, of the light-emitting pattern a3 of the sub-pixel may be in contact with the side, close to the base substrate 101, of the electrode layer a4 of the sub-pixel.

Here, the orthographic projection of the portion, in contact with both the electrode pattern a2 and the electrode layer a4, of the light-emitting pattern a3 of the first target sub-pixel 102a on the base substrate 101 covers the orthographic projection of the protruding structure A in the planarization layer a1 of the first target sub-pixel 102a on the base substrate 101. Because only the portion, in contact with both the electrode pattern a2 and the electrode layer a4, of the light-emitting pattern a3 can emit light normally, by making the orthographic projection of the portion, in contact with both the electrode pattern a2 and the electrode layer a4, of the light-emitting pattern a3 on the base substrate 101 cover the orthographic projection of the protruding structure A on the base substrate 101, it can be ensured that the region where the protruding structure A is disposed in the display panel can emit light normally.

Referring to FIG. 3 and FIG. 4, because the electrode pattern a2 of the first target sub-pixel 102a is disposed on the side, away from the base substrate 101, of the protruding structure A in the planarization layer a1, the electrode pattern a2 may be jacked up by the protruding structure A. In the case that the display panel 10 is bent, the angle of light emitted from the bending portion of the display panel 10 is adjusted by jacking up the electrode pattern a2 by the protruding structure A.

In summary, this embodiment of the present disclosure provides a display panel. In the display panel, the electrode pattern of the first target sub-pixel is jacked up by the protruding structure in the planarization layer of the first target sub-pixel, and the orthographic projection of the portion, in contact with both the electrode pattern and the electrode layer, of the light-emitting pattern on the base substrate covers the orthographic projection of the protruding structure on the base substrate. Therefore, the region where the protruding structure is disposed in the display panel can emit light normally. In addition, the protruding structure is provided in the planarization layer of the first target sub-pixel, which can ensure that the bending portion of the display panel can emit light normally, thereby avoiding color shift from occurring on images displayed on the side face of the display device. Thus, the display effect of the display device is relatively good.

Optionally, the electrode pattern a2 may be an anode (AND) pattern, and the electrode layer a4 may be a cathode layer.

In this embodiment of the present disclosure, the color of light emitted from at least one first target sub-pixel 102a is different from the color of light emitted from at least one second target sub-pixel 102b. The at least one first target sub-pixel 102a includes a blue (B) sub-pixel, and the at least one second target sub-pixel 102b includes at least one of a red (R) sub-pixel and a green (G) sub-pixel.

That is, the planarization layer a1 of the blue sub-pixel may be provided with a protruding structure A, and both the planarization layer a1 of the red sub-pixel and the planarization layer a1 of the green sub-pixel may be not provided with the protruding structure A.

Alternatively, all of the planarization layer a1 of the blue sub-pixel, the planarization layer a1 of the red sub-pixel, and the planarization layer a1 of the green sub-pixel may be provided with the protruding structure A. In addition, the length, in the direction perpendicular to the bearing surface of the base substrate 101, of the protruding structure A in each of the planarization layer a1 of the red sub-pixel and the planarization layer a1 of the green sub-pixel is smaller than the length, in the direction perpendicular to the bearing surface of the base substrate 101, of the protruding structure A in the planarization layer a1 of the blue sub-pixel. The length of the protruding structure A in the direction perpendicular to the bearing surface of the base substrate 101 may be the thickness of the protruding structure A.

Figure 5:
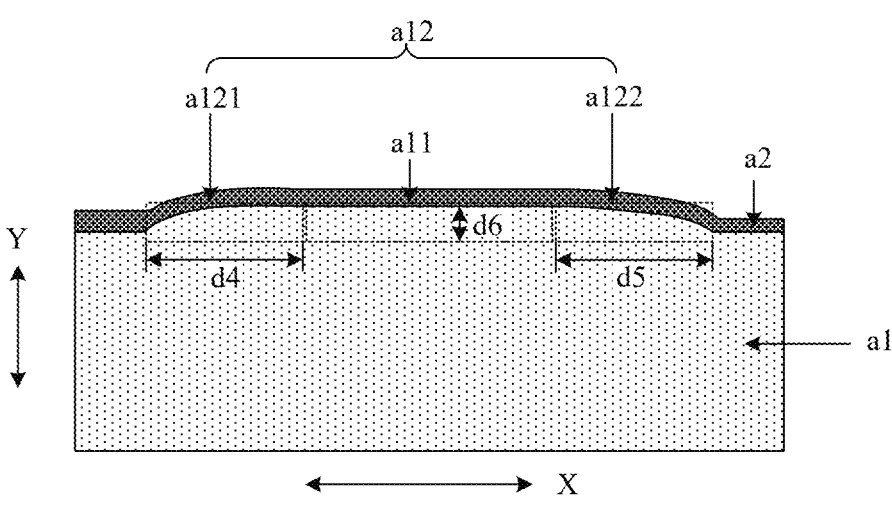
FIG. 5 is a schematic diagram of a planarization layer and an electrode pattern according to an embodiment of the present disclosure.

In this embodiment of the present disclosure, the at least one first target sub-pixel 102a includes a blue sub-pixel, a red sub-pixel, and a green sub-pixel. Referring to FIG. 5, the protruding structure A in the planarization layer a1 of the first target sub-pixel 102a includes a central region a11 and a peripheral region a12.

Optionally, in a first plane perpendicular to the bearing surface of the base substrate 101, a first angle between a tangent line of the peripheral region a12 of the protruding structure A in the blue sub-pixel and the side, close to the base substrate 101, of the protruding structure A may be greater than or equal to a second angle between a tangent line of the peripheral region a12 of the protruding structure A in the red sub-pixel and the side, close to the base substrate 101, of the protruding structure A. In addition, in the first plane perpendicular to the bearing surface of the base substrate 101, the first angle between the tangent line of the peripheral region a12 of the protruding structure A in the blue sub-pixel and the side, close to the base substrate 101, of the protruding structure A may be greater than or equal to a third angle between a tangent line of the peripheral region a12 of the protruding structure A in the green sub-pixel and the side, close to the base substrate 101, of the protruding structure A. Here, the side, close to the base substrate 101, of the protruding structure A may be a bottom surface of the protruding structure A.

That is, the first angle between the tangent line of the peripheral region a12 of the protruding structure A in the planarization layer a1 of the blue sub-pixel and the bottom surface of the protruding structure A may be designed to be relatively large. However, the second angle between the tangent line of the peripheral region a12 of the protruding structure A in the planarization layer a1 of the red sub-pixel and the bottom surface of the protruding structure A and the third angle between the tangent line of the peripheral region a12 of the protruding structure A in the planarization layer a1 of the green sub-pixel and the bottom surface of the protruding structure A may be designed to be relatively small.

The blue sub-pixel emits blue light, the red sub-pixel emits red light, and the green sub-pixel emits green light. The wavelength of the blue light is shorter than the wavelength of the red light and the wavelength of the green light. Therefore, in the bending portion of the display panel 10, the blue light is more difficult to emit than the red light and the green light. Therefore, the first angle between the tangent line of the peripheral region a12 of the protruding structure A in the planarization layer a1 of the blue sub-pixel and the bottom surface of the protruding structure A is designed to be relatively large, which can ensure that the light emitted from the blue sub-pixel can be emitted normally.

Optionally, the first angle may be greater than or equal to about 5° (degree) and smaller than or equal to about 40°. Both the second angle and the third angle are greater than or equal to about 0° and smaller than or equal to about 40°. For example, the first angle ranges from about 8° to about 12°, for example 10°.

Here, "about" may be a value within a range of an error caused by the manufacturing technology in the manufacture process, or a value within a range of a measurement error in a measurement process.

In the case that both the second angle and the third angle are 0°, it indicates that no protruding structure A is provided in the planarization layers a1 of the red sub-pixel and the green sub-pixel. The second angle may be equal to or different from the third angle, which is not limited in the embodiments of the present disclosure.

In addition, referring to FIG. 5, the orthographic projection of the side, away from the base substrate 101, of the protruding structure A on the base substrate 101 may be within the orthographic projection of the, close to the base substrate 101, of the protruding structure A on the base substrate 101. Thus, the angle between the tangent line of the peripheral region a12 of the protruding structure A and the side, close to the base substrate 101, of the protruding structure A may be an acute angle, which can ensure that the light emitted from the bending portion of the display panel can be emitted normally, thereby avoiding color shift from occurring on images displayed on the side face of the display device. Thus, the display effect of the display device is relatively good.

Referring to FIG. 5, the peripheral region a12 of each protruding structure A may include a first region a121 and a second region a122 opposite to each other. In the display panel 10, lengths, in a third direction X, of orthographic projections of the first target region and the second target region on the base substrate 101 are greater than or equal to a length threshold. The third direction X may be a pixel row direction.

The first target region is the first region a121 of protruding structure A in the planarization layer a1 of the blue sub-pixel. The second target region is the second region a122 of the protruding structure A in the planarization layer a1 of the blue sub-pixel.

The lengths, in the third direction X, of the orthographic projections of the first region a121 and the second region a122 of the protruding structure A in the planarization layer a1 of the blue sub-pixel on the base substrate 101 are designed to be relatively large, such that the first angle between the tangent line of the peripheral region a12 of the protruding structure A and the bottom surface of the protruding structure A is relatively small on the premise of preventing the planarization layer a1 from being too thick (an excessive thickness of the planarization layer a1 leads to an excessive thickness of the display panel, resulting in difficulty of achieving light and thinness), thereby ensuring that the light emitted from the blue sub-pixel can be emitted normally.

Optionally, the length threshold may be 1 μm (micrometer). That is, the lengths, in the third direction, of the orthographic projections of the first region a121 and the second region a122 of the protruding structure A in the planarization layer a1 of the blue sub-pixel on the base substrate 101 are greater than or equal to 1 μm. For example, the length d4, in the third direction X, of the orthographic projection of the first region a121 of the protruding structure A on the base substrate 101 and the length d5, in the third direction X, of the orthographic projection of the second region a122 of the protruding structure A on the base substrate 101 are approximately 2.5 μm.

For example, assuming that the protruding structure A in FIG. 5 is the protruding structure A in the planarization layer a1 of the blue sub-pixel, the length d4, in the third direction X, of the orthographic projection of the first region a121 of the protruding structure A on the base substrate 101 is 2.43 μm, and the length d5, in the third direction X, of the orthographic projection of the second region a122 of the protruding structure A on the base substrate 10 is 2.62 μm, that is, d4=2.43 μm, and d5=2.62 μm. For the protruding structure A in FIG. 5, the length d4, in the third direction X, of the orthographic projection of the first region a121 on the base substrate 101 is different from the length d5, in the third direction X, of the orthographic projection of the second region a122 on the base substrate 101. Certainly, the lengths may also be equal, which is not limited in the embodiments of the present disclosure.

In addition, referring to FIG. 5, the distance d6, in a fourth direction Y, between the side, away from the base substrate 101, of the protruding structure A and the side, close to the base substrate 101, of the protruding structure A is 0.31 μm, that is, d6=0.31 μm. The fourth direction Y is perpendicular to the bearing surface of the base substrate 101. The distance d6, in the fourth direction Y, between the side, away from the base substrate 101, of the protruding structure A and the side, close to the base substrate 101, of the protruding structure A may be the thickness of the protruding structure A.

Referring to FIG. 5, an orthographic projection of the central region a11 of the protruding structure A on the first plane may be a straight line, that is, the side, away from the base substrate 101, of the protruding structure A may be a plane. Here, the side, away from the base substrate 101, of the protruding structure A may be parallel to the bearing surface of the base substrate 101.

The orthographic projection of the protruding structure A on the first plane may be in the shape of a trapezoid. The orthographic projection of the first region a121 of the protruding structure A on the first plane and the orthographic projection of the second region a122 of the protruding structure A on the first plane may respectively be two legs of the trapezoid, and the orthographic projection of the central region a11 of the protruding structure A on the first plane may be an upper base of the trapezoid. In the case that the length of the orthographic projection of the first region a121 of the protruding structure A on the first plane is equal to the length of the orthographic projection of the second region a122 of the protruding structure A on the first plane, the orthographic projection of the protruding structure A on a reference plane may be in the shape of an isosceles trapezoid.

Figure 6:
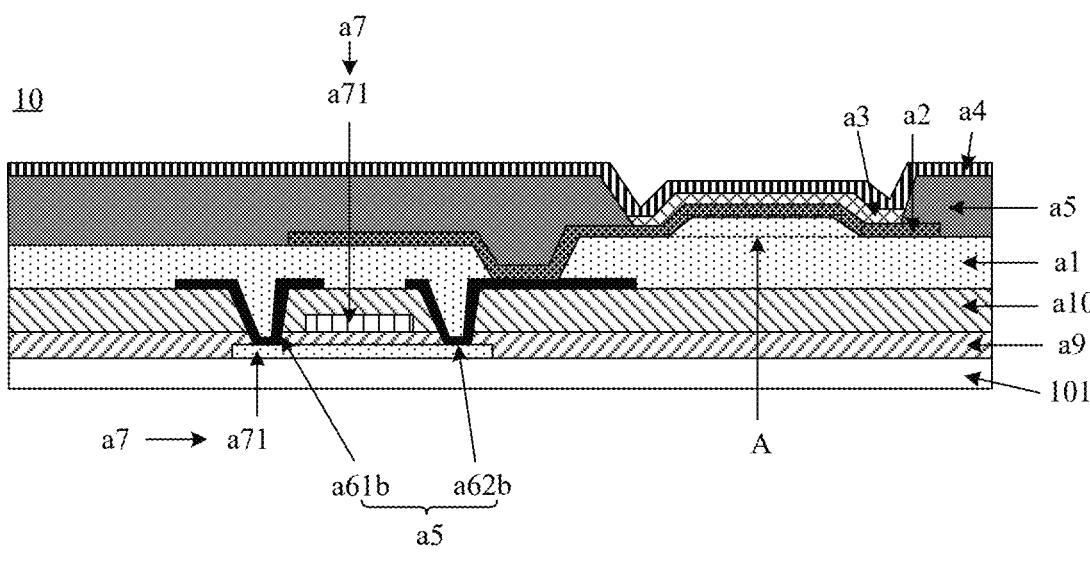
FIG. 6 is a schematic structural diagram of another display panel according to an embodiment of the present disclosure.
Figure 7:
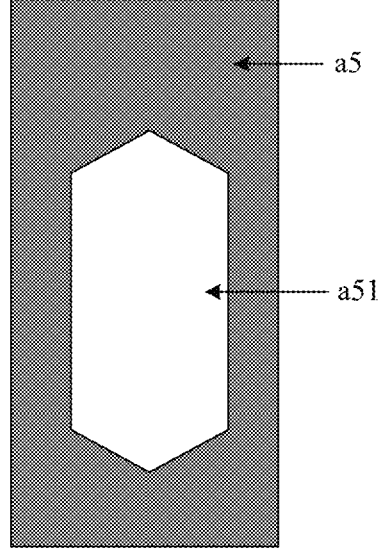
FIG. 7 is a top view of a pixel defining layer according to an embodiment of the present disclosure.

FIG. 6 is a schematic structural diagram of another display panel according to an embodiment of the present disclosure. Referring to FIG. 6, it can be known that each sub-pixel may further include a pixel defining layer (PDL) a5 disposed on the side, away from the base substrate 101, of the electrode pattern a2. Referring to FIG. 7, the pixel defining layer a5 may be provided with an opening a51. Referring to FIG. 7, the length of the opening a51 in the pixel defining layer a5 in a second direction W is greater than the length of the opening a51 in a first direction Z.

The opening a51 may expose a target portion of the electrode pattern a2 in the sub-pixel, such that at least a portion, disposed in the opening a51, of the light-emitting pattern a3 in the sub-pixel is in contact with the target portion. The target portion may include a portion, overlapping with the protruding structure A, of the electrode pattern a2. In this way, the orthographic projection of the at least the portion, disposed in the opening a51, of the light-emitting pattern a3 on the base substrate 101 may cover the orthographic projection of the protruding structure A on the base substrate 101.

Optionally, in addition to the portion, overlapping with the protruding structure A, of the electrode pattern a2, the target portion does not include any other portion. That is, the target portion may be the portion, overlapping with the protruding structure A, of the electrode pattern a2. The portion exposed from the opening a51 may be the portion, overlapping with the protruding structure A, of the electrode pattern a2. Alternatively, in addition to the portion, overlapping with the protruding structure A, of the electrode pattern a2, the target portion further includes portions, which is not limited in the embodiments of the present disclosure.

Because the protruding structure A is already provided in the planarization layer a1 of the first target sub-pixel 102a, it is ensured to a relatively great extent that light emitted from the first target sub-pixel 102a can be emitted normally. However, no protruding structure A may be provided in the planarization layer a1 of the second target sub-pixel 102b. Therefore, to ensure that light emitted from the second target sub-pixel 102b can still be emitted normally, the slope angle of the opening a51 in the pixel defining layer a5 of the second target sub-pixel 102b may be relatively large. The slope angle of the opening a51 in the pixel defining layer a5 is an angle between a side face of the opening a51 in the pixel defining layer a5 and the side, close to the base substrate 101, of the pixel defining layer a5.

Optionally, the slope angle of the opening a51 in the pixel defining layer a5 of each first target sub-pixel 102a may be smaller than the slope angle of the opening a51 in the pixel defining layer as of any second target sub-pixel 102b. That is, the slope angle of the opening a51 in the pixel defining layer a5 of the first target sub-pixel 102a may be relatively small, but the slope angle of the opening a51 in the pixel defining layer a5 of the second target sub-pixel 102b may be relatively large.

For example, the first target sub-pixel 102a includes a blue sub-pixel, and the second target sub-pixel 102b includes at least one of a red sub-pixel and a green sub-pixel. Therefore, the slope angle of the opening a51 in the pixel defining layer a5 of the blue sub-pixel is smaller than the slope angle of the opening a51 in the pixel defining layer a5 of the red sub-pixel, and smaller than the slope angle of the opening a51 in the pixel defining layer a5 of the green sub-pixel.

Figure 8:
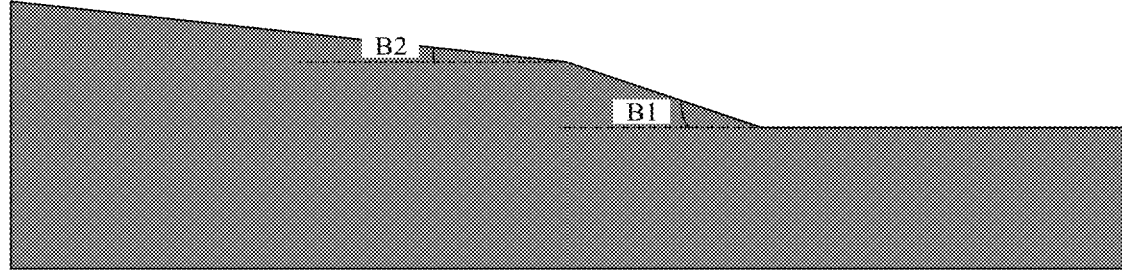
FIG. 8 is a schematic diagram of a pixel defining layer of a red sub-pixel according to an embodiment of the present disclosure.
Figure 9:
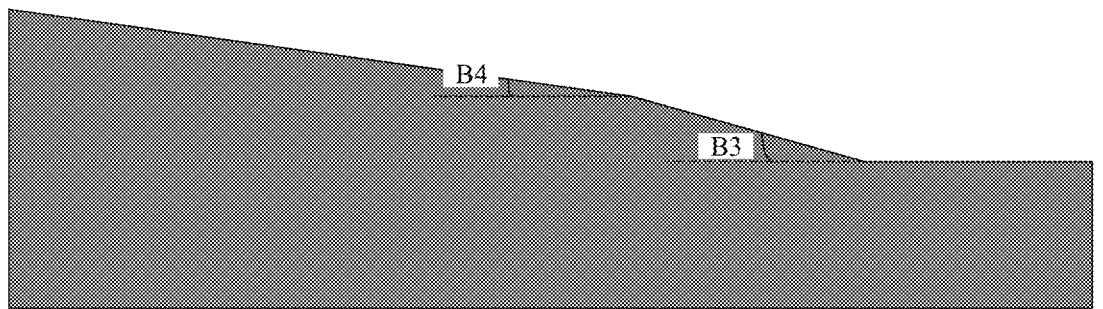
FIG. 9 is a schematic diagram of a pixel defining layer of a green sub-pixel according to an embodiment of the present disclosure.
Figure 10:
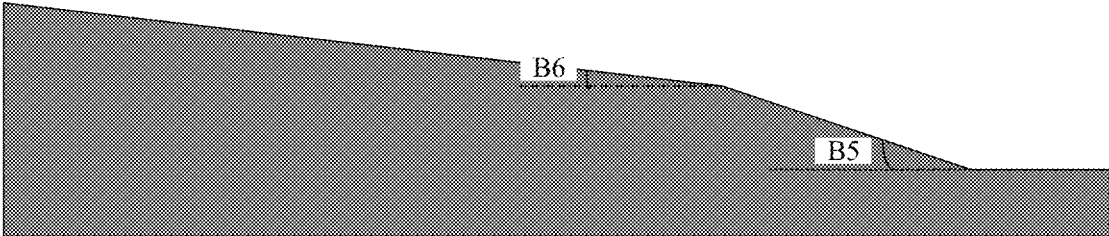
FIG. 10 is a schematic diagram of a pixel defining layer of a blue sub-pixel according to an embodiment of the present disclosure.

FIG. 8 is a schematic diagram of a pixel defining layer of a red sub-pixel according to an embodiment of the present disclosure. FIG. 9 is a schematic diagram of a pixel defining layer of a green sub-pixel according to an embodiment of the present disclosure. FIG. 10 is a schematic diagram of a pixel defining layer of a blue sub-pixel according to an embodiment of the present disclosure. With reference to FIG. 8 to FIG. 10, the slope angle of the opening a51 in the pixel defining layer a5 of each sub-pixel includes a first slope sub-angle and a second slope sub-angle. The first slope sub-angle is an angle between a tangent line of a portion of the side, close to the base substrate 101, of the side wall of the opening a51 in the pixel defining layer a5 and a plane parallel to the bearing surface of the base substrate 101. The second slope sub-angle is an angle between a tangent line of a middle portion of the side wall of the opening a51 in the pixel defining layer a5 and the plane parallel to the bearing surface of the base substrate 101. Generally, the first slope sub-angle of the pixel defining layer a5 of the sub-pixel is greater than the second slope sub-angle.

Optionally, the first slope sub-angle B5 of the opening a51 in the pixel defining layer a5 of the blue sub-pixel is smaller than the first slope sub-angle B1 of the opening a51 in the pixel defining layer a5 of the red sub-pixel, and smaller than the first slope sub-angle B3 of the opening a51 in the pixel defining layer as of the green sub-pixel. In addition, the second slope sub-angle B6 of the opening a51 in the pixel defining layer a5 of the blue sub-pixel is smaller than the second slope sub-angle B2 of the opening a51 in the pixel defining layer a5 of the red sub-pixel, and smaller than the second slope sub-angle B4 of the opening a51 in the pixel defining layer a5 of the green sub-pixel.

Referring to FIG. 8 to FIG. 10, the first slope sub-angle B1 of the opening a51 in the pixel defining layer a5 of the red sub-pixel is 27.8°, that is, A1=27.89. The second slope sub-angle B2 of the opening a51 in the pixel defining layer a5 of the red sub-pixel is 13.9°, that is, A2=13.9°. The first slope sub-angle B3 of the opening a51 in the pixel defining layer a5 of the green sub-pixel is 20.9°, that is, A3=20.9°. The second slope sub-angle B4 of the opening a51 in the pixel defining layer a5 of the green sub-pixel is 13.2°, that is, A4=13.2°. The first slope sub-angle B5 of the opening a51 in the pixel defining layer a5 of the blue sub-pixel is 19.8°, that is, A5=19.8°. The second slope sub-angle B6 of the opening a51 in the pixel defining layer as of the blue sub-pixel is 13.0°, that is, a7=13.0°.

Figure 11:
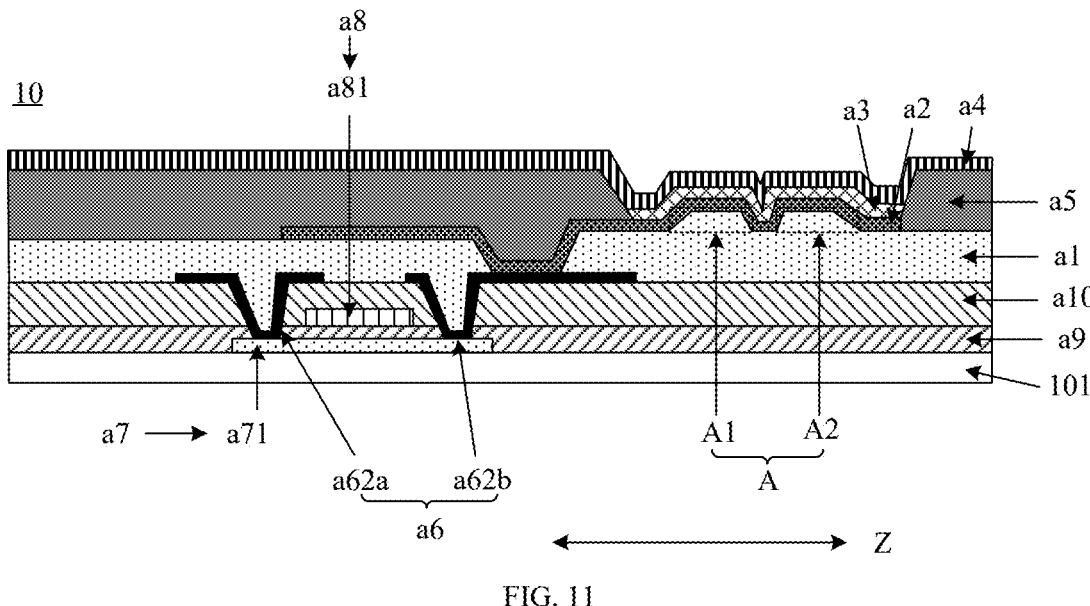
FIG. 11 is a schematic structural diagram of still another display panel according to an embodiment of the present disclosure.
Figure 12:
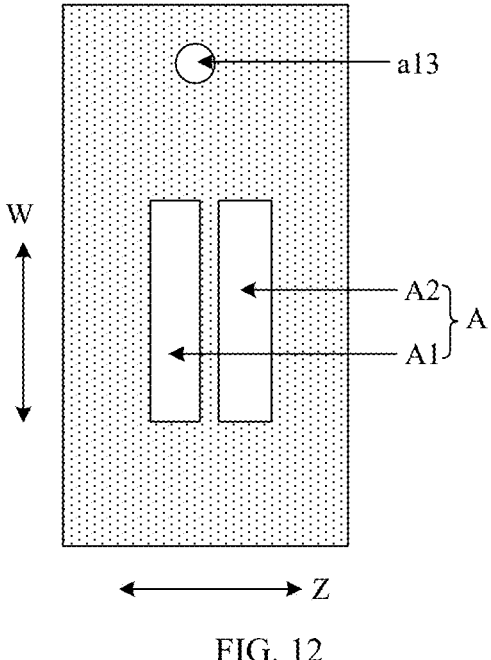
FIG. 12 is a schematic diagram of a planarization layer of a first target sub-pixel according to an embodiment of the present disclosure.

FIG. 11 is a schematic structural diagram of still another display panel according to an embodiment of the present disclosure. FIG. 12 is a schematic diagram of a planarization layer of a first target sub-pixel according to an embodiment of the present disclosure. It can be known from FIG. 11 and FIG. 12 that the protruding structure A in each first target sub-pixel 102a may include a first protruding sub-structure A1 and a second protruding sub-structure A2 which are arranged in the first direction Z.

The length of the first protruding sub-structure A1 in the second direction W may be greater than the length of the first protruding sub-structure A1 in the first direction Z. The length of the second protruding sub-structure A2 in the second direction W may be greater than the length of the second protruding sub-structure A2 in the first direction Z. The second direction W may be approximately perpendicular to the first direction Z, and both the first direction Z and the second direction W may be approximately parallel to the bearing surface of the base substrate 101.

Optionally, the length of the first protruding sub-structure A1 in the first direction Z is approximately equal to the length of the second protruding sub-structure A2 in the first direction Z. The length of the first protruding sub-structure A1 in the second direction W is approximately equal to the length of the second protruding sub-structure A2 in the second direction W. For example, referring to FIG. 12, both the orthographic projection of the first protruding sub-structure A1 on the base substrate 101 and the orthographic projection of the second protruding sub-structure A2 on the base substrate 101 may be rectangles. In addition, the length of the first protruding sub-structure A1 may be equal to the length of the second protruding sub-structure A2, and the width of the first protruding sub-structure A1 may be equal to the width of the second protruding sub-structure A2.

Here, "approximately" refers to that an error range within 15% may be allowed. For example, "approximately parallel" may refer to that the angle therebetween ranges from 0° to 30°. For example, the angle may range from 0° to 10° or from 0° to 15°. "Approximately parallel" may refer to that the angle therebetween ranges from 60° to 90°. For example, the angle may range from 80° to 90° or from 75° to 90°. "Approximately equal" may refer to that the difference between two lengths does not exceed 15%.

Figure 13:
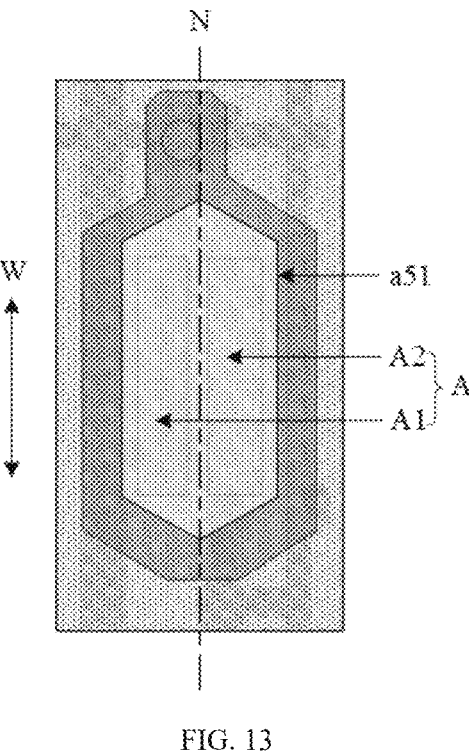
FIG. 13 is a schematic diagram of a partial structure of a display panel according to an embodiment of the present disclosure.

FIG. 13 is a schematic diagram of a partial structure of a display panel according to an embodiment of the present disclosure. Referring to FIG. 13, the light-emitting region of each first target sub-pixel 102*a* may have a symmetry axis N extending in the second direction W. The light-emitting region of the first target sub-pixel 102*a* may be a region of the portion, in contact with both the electrode pattern a2 and the electrode layer a4, of the light-emitting pattern a3.

The orthographic projection of the first protruding sub-structure A1 on the base substrate 101 is approximately symmetric to the orthographic projection of the second protruding sub-structure A2 on the base substrate 101 about the orthographic projection of the symmetry axis N on the base substrate 101. In addition, it can be known from FIG. 13 that, both the orthographic projection of the first protruding sub-structure A1 on the base substrate 101 and the orthographic projection of the second protruding sub-structure A2 on the base substrate 101 are within the orthographic projection of the opening a51 in the pixel defining layer a5 on the base substrate 101.

Figure 14:
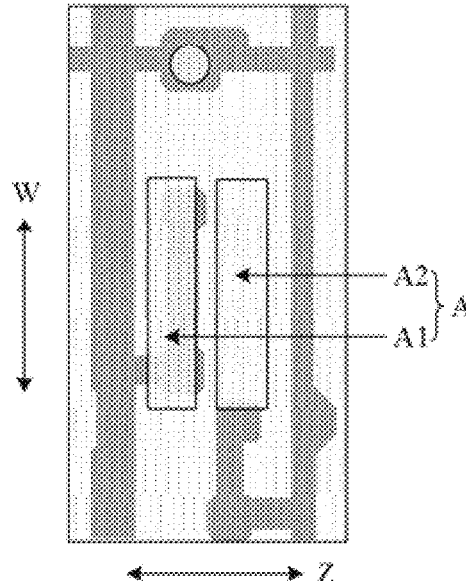
FIG. 14 is a schematic diagram of a source and drain metal pattern and a planarization layer according to an embodiment of the present disclosure.

Referring to FIG. 6 and FIG. 11, each sub-pixel may further include a source and drain layer a6 disposed on the side, close to the base substrate 101, of the planarization layer a1. The source and drain layer a6 may include a source and drain metal pattern. FIG. 14 is a schematic diagram of a source and drain metal pattern and a planarization layer according to an embodiment of the present disclosure. Referring to FIG. 14, the orthographic projection of the protruding structure A in each first target sub-pixel 102*a* on the base substrate 101 may be at least partially overlapped with the orthographic projection of the source and drain metal pattern on the base substrate 101.

Figure 15:
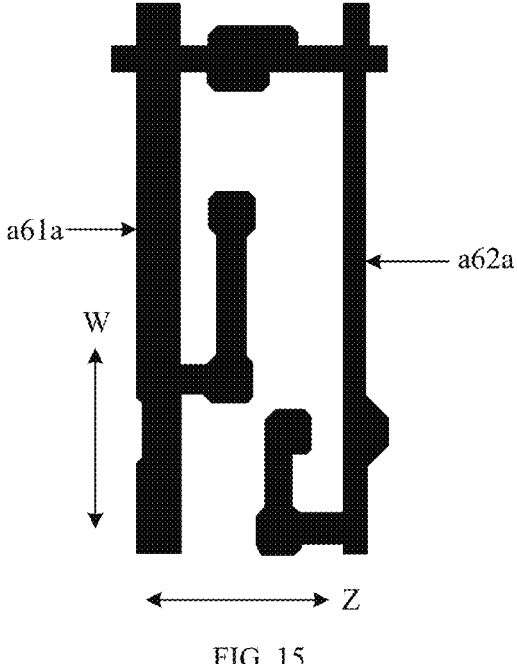
FIG. 15 is a schematic structural diagram of a source and drain metal pattern according to an embodiment of the present disclosure.

FIG. 15 is a schematic structural diagram of a source and drain metal pattern according to an embodiment of the present disclosure. It can be known from FIG. 15 that, the source and drain metal pattern may include a first pattern a61*a* and a second pattern a62*a*. The length of the first pattern a61*a* in the second direction W may be greater than the length of the first pattern a61*a* in the first direction Z. The length of the second pattern a62*a* in the second direction W may be greater than the length of the second pattern a62*a* in the first direction Z.

Figure 16:
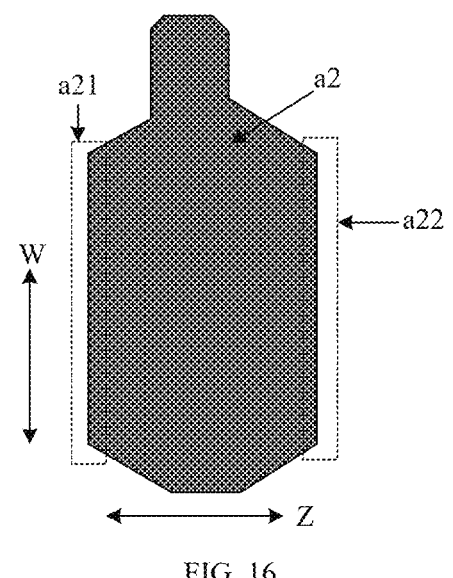
FIG. 16 is a schematic structural diagram of an electrode pattern according to an embodiment of the present disclosure.
Figure 17:
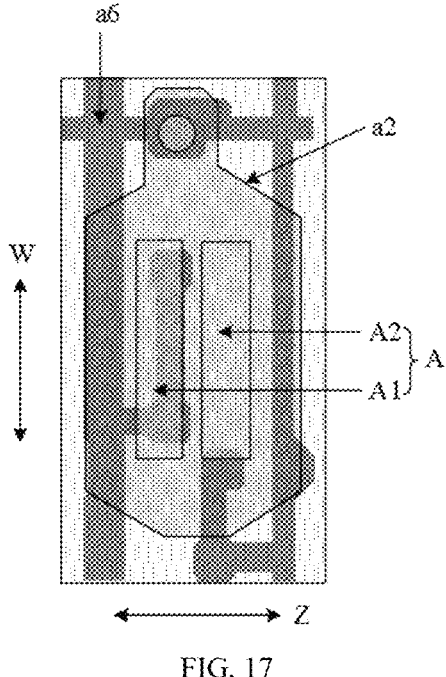
FIG. 17 is a schematic diagram of a source and drain layer, a planarization layer, and an electrode pattern according to an embodiment of the present disclosure.

FIG. 16 is a schematic structural diagram of an electrode pattern according to an embodiment of the present disclosure. It can be known from FIG. 16 that, the length of the electrode pattern a2 in the second direction W is greater than the length of the electrode pattern a2 in the first direction Z. The electrode pattern a2 includes a first edge portion a21 and a second edge portion a22 which are arranged in the first direction Z. With reference to FIG. 15 to FIG. 17, the orthographic projection of the first edge portion a21 on the base substrate 101 is overlapped with the orthographic projection of the first pattern a61*a* on the base substrate 101, and the orthographic projection of the second edge portion a22 on the base substrate 101 is overlapped with the orthographic projection of the second pattern a62*a* on the base substrate 101.

In this embodiment of the present disclosure, the ratio of the maximum size, on a second plane, of the protruding structure A in each first target sub-pixel 102*a* to the maximum size of the protruding structure A in the direction perpendicular to the bearing surface of the base substrate 101 is greater than or equal to about 5 and smaller than or equal to about 20. The second plane is approximately parallel to the bearing surface.

Assuming that the orthographic projection of the protruding structure A in the first target sub-pixel 102*a* on the base substrate 101 is a rectangle, then the maximum size, on the second plane, of the protruding structure A in the first target sub-pixel 102*a* may be the length of the rectangle, and the maximum size of the protruding structure A in the direction perpendicular to the bearing surface of the base substrate 101 may be the thickness of the protruding structure A.

In this embodiment of the present disclosure, generally, light emitted from the second sub-pixel 103 disposed in the planar display region 101*b* can be emitted normally, and thus the protruding structure A may needn't be provided in the planarization layer a1 of the second sub-pixel 103. Certainly, the plurality of second sub-pixels 103 may include at least one third target sub-pixel and at least one fourth target sub-pixel. The planarization layer a1 of the third target sub-pixel may be provided with a protruding structure A. The maximum distance between the side, away from the base substrate 101, of the planarization layer a1 of the fourth target sub-pixel and the side, close to the base substrate 101, of the planarization layer a1 of the fourth target sub-pixel is smaller than the maximum distance between the side, away from the base substrate 101, of the planarization layer a1 of the third target sub-pixel and the side, close to the base substrate 101, of the planarization layer a1 of the third target sub-pixel.

For the structure of the third target sub-pixel, reference may be made to the structure of the first target sub-pixel 102*a* in FIG. 3 or FIG. 4. For the structure of the fourth target sub-pixel, reference may be made to the structure of the second target sub-pixel 102*b* in FIG. 3 or FIG. 4.

The maximum distance between the side, away from the base substrate 101, of the planarization layer a1 of the fourth target sub-pixel and the side, close to the base substrate 101, of the planarization layer a1 of the fourth target sub-pixel may be the maximum length of the planarization layer a1 of the fourth target sub-pixel in the direction perpendicular to the bearing surface of the base substrate 101. The maximum distance between the side, away from the base substrate 101, of the planarization layer a1 of the third target sub-pixel and the side, close to the base substrate 101, of the planarization layer a1 of the third target sub-pixel may be the maximum length of the planarization layer a1 of the third target sub-pixel in the direction perpendicular to the bearing surface of the base substrate 101.

Optionally, the planarization layer a1 of the fourth target sub-pixel may not be provided with the protruding structure A, such that the distance between the side, away from the base substrate 101, of the planarization layer a1 of the fourth target sub-pixel and the side, close to the base substrate 101, of the planarization layer a1 of the fourth target sub-pixel may be equal at all positions. In this case, the maximum length of the planarization layer a1 of the fourth target sub-pixel in the direction perpendicular to the bearing surface of the base substrate 101 is the distance between the side, away from the base substrate 101, of the planarization layer a1 of the fourth target sub-pixel and the side, close to the base substrate 101, of the planarization layer a1 of the fourth target sub-pixel.

In this embodiment of the present disclosure, the distance between the side, away from the base substrate 101, of a portion other than the protruding structure A of the planarization layer a1 and the side, close to the base substrate 101, of this portion is a fixed value. That is, in the case that the planarization layer a1 of the fourth target sub-pixel is not provided with the protruding structure A, the distance between the side, away from the base substrate 101, of a portion other than the protruding structure A of the planarization layer a1 of the third target sub-pixel and the side, close to the base substrate 101, of this portion is equal to the maximum length of the planarization layer a1 of the fourth target sub-pixel in the direction perpendicular to the bearing surface of the base substrate 101. By providing the protruding structure A in the planarization layer a1 of the third target sub-pixel, the maximum length of the planarization layer a1 of the third target sub-pixel in the direction perpendicular to the bearing surface of the base substrate 101 is greater than the maximum length of the planarization layer a1 of the fourth target sub-pixel in the direction perpendicular to the bearing surface of the base substrate 101.

Alternatively, the planarization layer a1 of the fourth target sub-pixel may also be provided with a protruding structure A. However, the length of the protruding structure A in the planarization layer a1 of the fourth target sub-pixel in the direction perpendicular to the bearing surface of the base substrate 101 is smaller than the length of the protruding structure A in the planarization layer a1 of the third target sub-pixel in the direction perpendicular to the bearing surface of the base substrate 101, such that the maximum length of the planarization layer a1 of the third target sub-pixel in the direction perpendicular to the bearing surface of the base substrate 101 is greater than the maximum length of the planarization layer a1 of the fourth target sub-pixel in the direction perpendicular to the bearing surface of the base substrate 101.

Optionally, the maximum size of the protruding structure A of each third target sub-pixel in the direction perpendicular to the bearing surface of the base substrate 101 is smaller than the maximum size of the protruding structure A of any first target sub-pixel 102a in the direction perpendicular to the bearing surface. That is, the thickness of the protruding structure A of the first target sub-pixel 102a disposed in the curved display region 101a is greater than the thickness of the protruding structure A of the third target sub-pixel disposed in the planar display region 101b.

The larger the thickness of the protruding structure A of the sub-pixel is, the more easily the light from the sub-pixel is emitted out. In addition, compared with light emitted from the first sub-pixel 102 in the curved display region 101a, light emitted from the second sub-pixel 103 in the planar display region 101b is emitted out more easily. Therefore, the thickness of the protruding structure A of the third target sub-pixel of the second sub-pixels 103 may be smaller than the thickness of the protruding structure A of the first target sub-pixel 102a.

It can be known from FIG. 6 and FIG. 11 that the sub-pixel may further include an active layer a7 and a gate layer a8 that are sequentially laminated in a direction going away from the base substrate 101. The active layer a7 is insulated from the gate layer a8, and the gate layer a8 is insulated from the source and drain layer a6. For example, the sub-pixel further includes a gate insulating layer a9 and a passivation layer a10. The gate insulating layer a9 may be disposed between the active layer a7 and the gate layer a8, and the passivation layer a10 may be disposed between the gate layer a8 and the source and drain layer a6.

The active layer a7 may include an active pattern a71. The gate layer a8 may include a gate pattern a81 corresponding to the active pattern a71. The source and drain metal pattern in the source and drain layer a6 includes a source a61b and a drain a62b. Both the source a61b and the drain a62b are connected to the active pattern a71. The drain a62b is further connected to the electrode pattern a2, to provide a drive signal for the electrode pattern a2.

Optionally, referring to FIG. 12, the planarization layer a1 of each sub-pixel may further be provided with a via hole a13. For each first target sub-pixel 102a, an orthographic projection of the via hole a13 on the base substrate 101 is separate from an orthographic projection of the protruding structure A on the base substrate 101. That is, the orthographic projection of the via hole a13 on the base substrate 101 is not overlapped with the orthographic projection of the protruding structure A on the base substrate 101. The via hole a13 may be configured to expose at least a portion of the drain a62b. A portion of the electrode pattern a2 may be disposed in the via hole a13, so as to be connected to the exposed portion of the drain a62b.

In summary, this embodiment of the present disclosure provides a display panel. In the display panel, the electrode pattern of the first target sub-pixel is jacked up by the protruding structure in the planarization layer of the first target sub-pixel, and the orthographic projection of the portion, in contact with both the electrode pattern and the electrode layer, of the light-emitting pattern on the base substrate covers the orthographic projection of the protruding structure on the base substrate. Therefore, the region where the protruding structure is disposed in the display panel can emit light normally. In addition, the protruding structure is provided in the planarization layer of the first target sub-pixel, which can ensure that the bending portion of the display panel can emit light normally, thereby avoiding color shift from occurring on images displayed on the side face of the display device. Thus, the display effect of the display device is relatively good.

Figure 18:
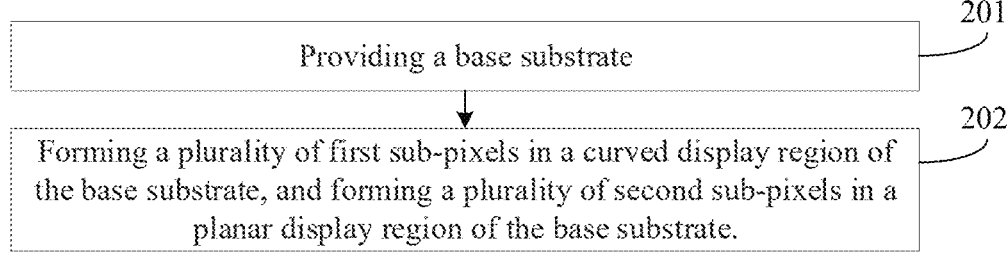
FIG. 18 is a flowchart of a method for manufacturing a display panel according to an embodiment of the present disclosure.

FIG. 18 is a flowchart of a method for manufacturing a display panel according to an embodiment of the present disclosure. The method may be applicable to manufacture the display panel 10 provided in the foregoing embodiments. Referring to FIG. 18, the method may include the following steps.

In step 201, a base substrate is provided.

In this embodiment of the present disclosure, a base substrate 101 may be provided first. The base substrate 101 may be provided with a curved display region 101a and a planar display region 101b. The curved display region 101a may be configured for curved display. The base substrate 101 may be a flexible substrate.

In step 202, a plurality of first sub-pixels are formed in the curved display region of the base substrate, and a plurality of second sub-pixels are formed in the planar display region of the base substrate.

In this embodiment of the present disclosure, referring to FIG. 2, the curved display region 101*a* includes two sub-regions (c1 and c2). The two sub-regions (c1 and c2) are regions on the left and right edges of the base substrate 101 respectively, and are disposed on two sides of the planar display region 101*b* respectively. Therefore, the plurality of formed first sub-pixels 102 may be disposed in the regions on the left and right edges of the base substrate 101, and the plurality of formed second sub-pixels 103 may be disposed in a region between the regions on the left and right edges of the base substrate 101. The plurality of first sub-pixels 102 include at least one first target sub-pixel 102*a* and at least one second target sub-pixel 102*b*.

Referring to FIG. 19, forming the first sub-pixels 102 and the second sub-pixels 103 include the following steps.

In step 2021*a*, a planarization layer is formed on a side of the base substrate.

In this embodiment of the present disclosure, the planarization layer a1 of each sub-pixel may be manufactured through a one-time patterning process. The formed planarization layer a1 of the first target sub-pixel 102*a* in the first sub-pixels 102 may be provided with a protruding structure A. The maximum distance d2 between the side, away from the base substrate 101, of the planarization layer a1 of the second target sub-pixel 102*b* in the first sub-pixels 102 and the side, close to the base substrate 101, of the planarization layer a1 of the second target sub-pixel 102*b* is smaller than the maximum distance d1 between the side, away from the base substrate 101, of the planarization layer a1 of the first target sub-pixel 102*a* and the side, close to the base substrate 101, of the planarization layer a1 of the first target sub-pixel 102*a*.

The maximum distance d2 between the side, away from the base substrate 101, of the planarization layer a1 of the second target sub-pixel 102*b* and the side, close to the base substrate 101, of the planarization layer a1 of the second target sub-pixel 102*b* may be the maximum length of the planarization layer a1 of the second target sub-pixel 102*b* in the direction perpendicular to the bearing surface of the base substrate 101. The maximum distance d1 between the side, away from the base substrate 101, of the planarization layer a1 of the first target sub-pixel 102*a* and the side, close to the base substrate 101, of the planarization layer a1 of the first target sub-pixel 102*a* may be the maximum length of the planarization layer a1 of the first target sub-pixel 102*a* in the direction perpendicular to the bearing surface of the base substrate 101.

Optionally, the planarization layer a1 of the second target sub-pixel 102*b* may not be provided with the protruding structure A, such that the distance between the side, away from the base substrate 101, of the planarization layer a1 of the second target sub-pixel 102*b* and the side, close to the base substrate 101, of the planarization layer a1 of the second target sub-pixel 102*b* may be equal at all positions. In this case, the maximum length d2 of the planarization layer a1 of the second target sub-pixel 102*b* in the direction perpendicular to the bearing surface of the base substrate 101 is the distance between the side, away from the base substrate 101, of the planarization layer a1 of the second target sub-pixel 102*b* and the side, close to the base substrate 101, of the planarization layer a1 of the second target sub-pixel 102*b*.

In this embodiment of the present disclosure, the distance between the side, away from the base substrate 101, of a portion other than the protruding structure A of the planarization layer a1 and the side, close to the base substrate 101, of this portion is a fixed value. That is, in the case that the planarization layer a1 of the second target sub-pixel 102*b* is not provided with the protruding structure A, the distance d3 between the side, away from the base substrate 101, of a portion other than the protruding structure A of the planarization layer a1 of the first target sub-pixel 102*a* and the side, close to the base substrate 101, of this portion is equal to the maximum length d2 of the planarization layer a1 of the second target sub-pixel 102*b* in the direction perpendicular to the bearing surface of the base substrate 101. By providing the protruding structure A in the planarization layer a1 of the first target sub-pixel 102*a*, the maximum length d1 of the planarization layer a1 of the first target sub-pixel 102*a* in the direction perpendicular to the bearing surface of the base substrate 101 is greater than the maximum length d2 of the planarization layer a1 of the second target sub-pixel 102*b* in the direction perpendicular to the bearing surface of the base substrate 101.

Alternatively, the planarization layer a1 of the second target sub-pixel 102*b* may also be provided with a protruding structure A. However, the length of the protruding structure A in the planarization layer a1 of the second target sub-pixel 102*b* in the direction perpendicular to the bearing surface of the base substrate 101 is smaller than the length of the protruding structure A in the planarization layer a1 of the first target sub-pixel 102*a* in the direction perpendicular to the bearing surface of the base substrate 101, such that the maximum length d1 of the planarization layer a1 of the first target sub-pixel 102*a* in the direction perpendicular to the bearing surface of the base substrate 101 is greater than the maximum length d2 of the planarization layer a1 of the second target sub-pixel 102*b* in the direction perpendicular to the bearing surface of the base substrate 101.

In this embodiment of the present disclosure, the curved display region 101*a* of the base substrate 101 may form a bending portion of the display panel. Because the first target sub-pixel 102*a* in the first sub-pixels 102 disposed in the curved display region 101*a* is provided with a protruding structure A, light emitted from the bending portion of the display panel 10 can be emitted normally, which ensures the display effect of the display device. In addition, the planar display region 101*b* of the base substrate 101 may form a non-bending portion of the display panel. Generally, as light emitted from the non-bending portion of the display panel can be emitted normally, angle adjustment does not need to be performed on the light emitted from the non-bending portion of the display panel Therefore, the planarization layer a1 of the second sub-pixel 103 disposed in the planar display region 101*b* may be not provided with the protruding structure A. Certainly, the planarization layer a1 of the second sub-pixel 103 may also be provided with the protruding structure A, which is not limited in the embodiments of the present disclosure.

It should be noted that among the plurality of formed second sub-pixels 103, the planarization layer a1 of each second sub-pixel 103 is not provide with the protruding structure A. Alternatively, the planarization layers a1 of some of the second sub-pixels 103 may be provided with the protruding structures A, which is not limited in the embodiments of the present disclosure.

In step 2022*a*, an electrode pattern is formed on a side, away from the base substrate, of the planarization layer.

In this embodiment of the present disclosure, the electrode patterns a2 of all the sub-pixels may be manufactured through the same patterning process. In addition, the electrode pattern a2 of the sub-pixel is disposed on the side, away from the base substrate 101, of the planarization layer a1 of the sub-pixel.

For the first target sub-pixel 102*a*, the planarization layer a1 of the first target sub-pixel 102*a* is provided with the protruding structure A. Therefore, the orthographic projection of the electrode pattern a2 of the first target sub-pixel 102*a* on the base substrate 101 may cover the orthographic projection of the protruding structure A on the base substrate 101. That is, the side, away from the base substrate 101, of the protruding structure A is in complete contact with the side, close to the base substrate 101, of the electrode pattern a2. Alternatively, it may be understood that the portion, in contact with the electrode pattern a2, of the protruding structure A is an entire side, away from the base substrate 101, of the protruding structure A.

In step 2023*a*, a light-emitting pattern is formed on a side, away from the base substrate, of the electrode pattern.

In this embodiment of the present disclosure, the light-emitting patterns a3 of all the sub-pixels may be manufactured through the same patterning process. In addition, the light-emitting pattern a3 of each sub-pixel is disposed on the side, away from the base substrate 101, of the electrode pattern a2 of the sub-pixel. The side, close to the base substrate 101, of the light-emitting pattern a3 may be in contact with the side, away from the base substrate 101, of the electrode pattern a2.

In step 2024*a*, an electrode layer is formed on a side, away from the base substrate, of the light-emitting pattern.

In this embodiment of the present disclosure, the sub-pixels may share one electrode layer a4, that is, the electrode layers a4 of the plurality of sub-pixels is an integral structure. The electrode layer a4 of the sub-pixel may be disposed on the side, away from the base substrate 101, of the light-emitting pattern a3 of the sub-pixel, and the side, away from the base substrate 101, of the light-emitting pattern a3 may be in contact with the side, close to the base substrate 101, of the electrode layer a4.

In addition, for the first target sub-pixel 102*a*, the orthographic projection of a portion, in contact with both the electrode pattern a2 and the electrode layer a4, of the light-emitting pattern a3 of the first target sub-pixel 102*a* on the base substrate 101 covers the orthographic projection of the protruding structure A in the planarization layer a1 of the first target sub-pixel 102*a* on the base substrate 101. Because only the portion, in contact with both the electrode pattern a2 and the electrode layer a4, of the light-emitting pattern a3 can emit light normally, by making the orthographic projection of the portion, in contact with both the electrode pattern a2 and the electrode layer a4, of the light-emitting pattern a3 on the base substrate 101 cover the orthographic projection of the protruding structure A on the base substrate 101, it can be ensured that the region where the protruding structure A is disposed in the manufactured display panel can emit light normally.

FIG. 20 is another flowchart of forming a first sub-pixel and a second sub-pixel according to an embodiment of the present application. Referring to FIG. 20, the method may include the following steps.

In step 2021*b*, an active layer, a gate insulating layer, a gate layer, a passivation layer, and a source and drain layer are sequentially formed on a side of the base substrate.

Figure 21:
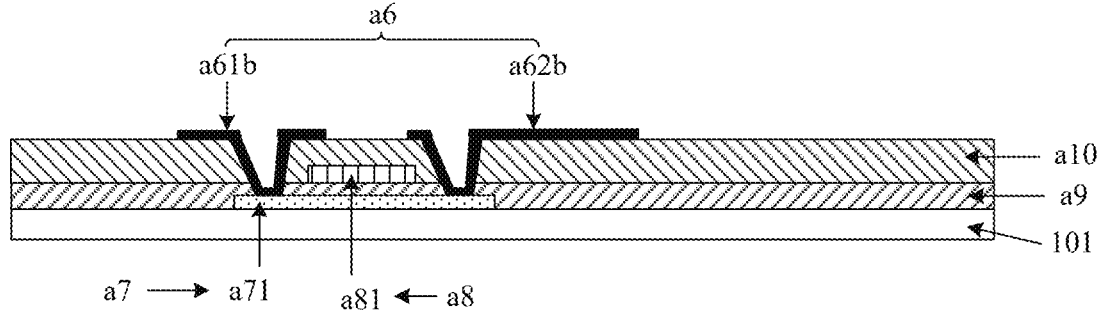
FIG. 21 is a schematic diagram of formation of an active layer, a gate insulating layer, a gate layer, a passivation layer, and a source and drain layer according to an embodiment of the present disclosure.

In this embodiment of the present disclosure, referring to FIG. 21, the active layer a7 may include an active pattern a71. The gate layer a8 may include a gate pattern a81 corresponding to the active pattern a71. The source and drain layer a6 may include a source a61*b* and a drain a62*b*. Both the source a61*b* and the drain a62*b* are connected to the active pattern a71.

Figure 22:
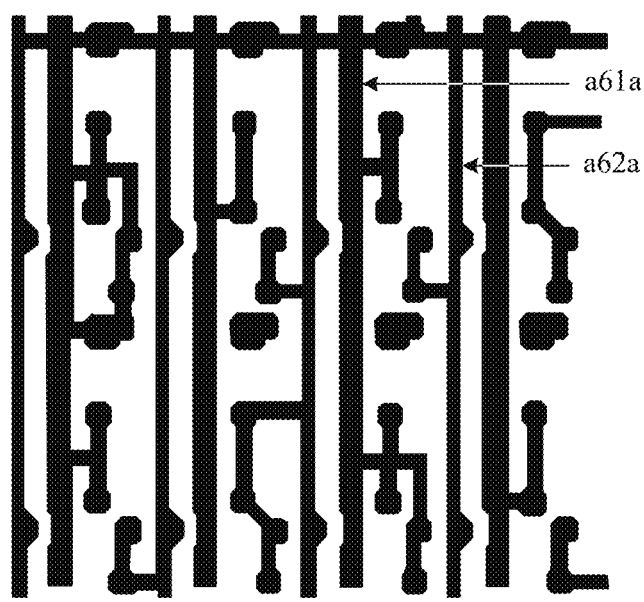
FIG. 22 is a schematic structural diagram of source and drain layers of a plurality of sub-pixels according to an embodiment of the present disclosure.

FIG. 22 is a schematic diagram of source and drain layers of a plurality of sub-pixels according to an embodiment of the present disclosure. With reference to FIG. 15 and FIG. 22, the source and drain metal pattern in the source and drain layer a6 includes a first pattern a61*a* and a second pattern a62*a*. The length of the first pattern a61*a* in the second direction W may be greater than the length of the first pattern a61*a* in the first direction Z. The length of the second pattern a62*a* in the second direction W may be greater than the length of the second pattern a62*a* in the first direction Z. In addition, referring to FIG. 22, the first patterns a61*a* in the source and drain metal patterns of the sub-pixels in the same column may be an integral structure; and the second patterns a62*a* in the source and drain metal patterns of the sub-pixels in the same column may be an integral structure.

In step 2022*b*, a planarization layer is formed on a side, away from the base substrate, of the source and drain layer.

In this embodiment of the present disclosure, the step of forming the planarization layer a1 may include the following steps.

Figure 23:
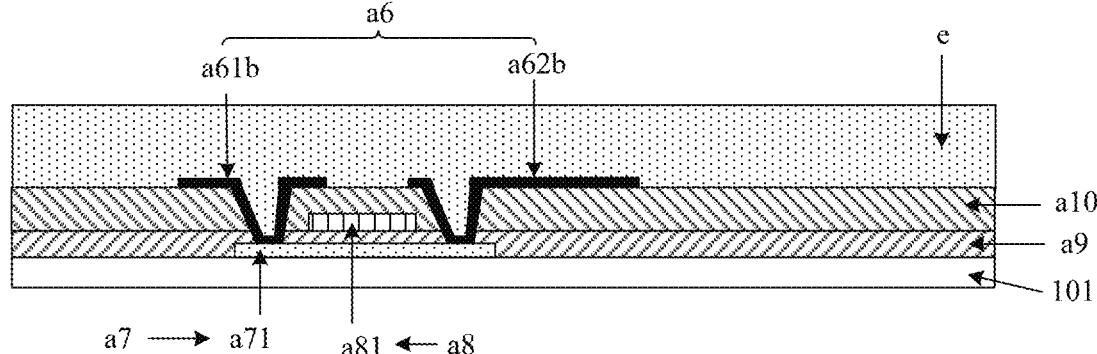
FIG. 23 is a schematic diagram of formation of a planarization film layer according to an embodiment of the present application.

In step S1, a planarization film layer is formed on the side, away from the base substrate, of the source and drain layer. Referring to FIG. 23, the side, away from the base substrate 101, of the planarization film layer e is flat surface.

In step S2, photoresist is coated.

In step S3, a halftone mask is adopted to expose the photoresist.

In step S4, development is performed on the photoresist.

In step S5, the planarization layer is acquired by etching the planarization film layer.

Figure 24:
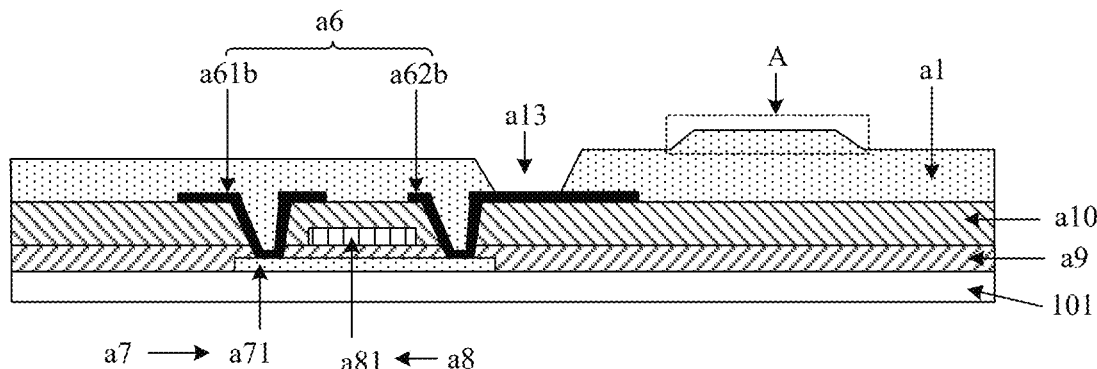
FIG. 24 is a schematic diagram of formation of a planarization layer according to an embodiment of the present application.
Figure 25:
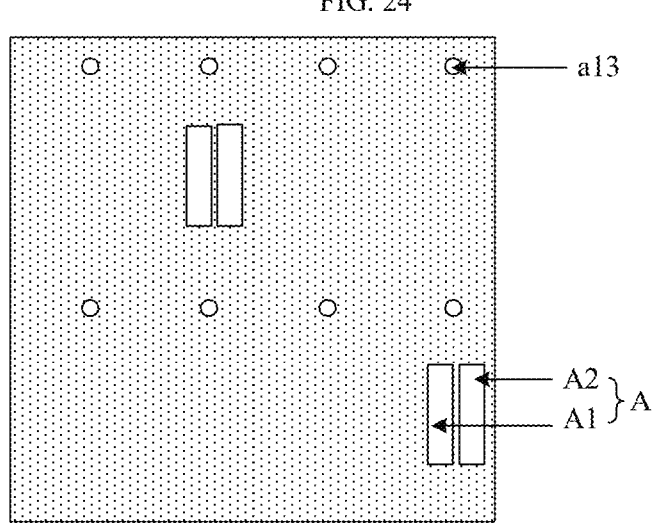
FIG. 25 is a top view of planarization layers of a plurality of sub-pixels according to an embodiment of the present disclosure.
Figures 26, 27:
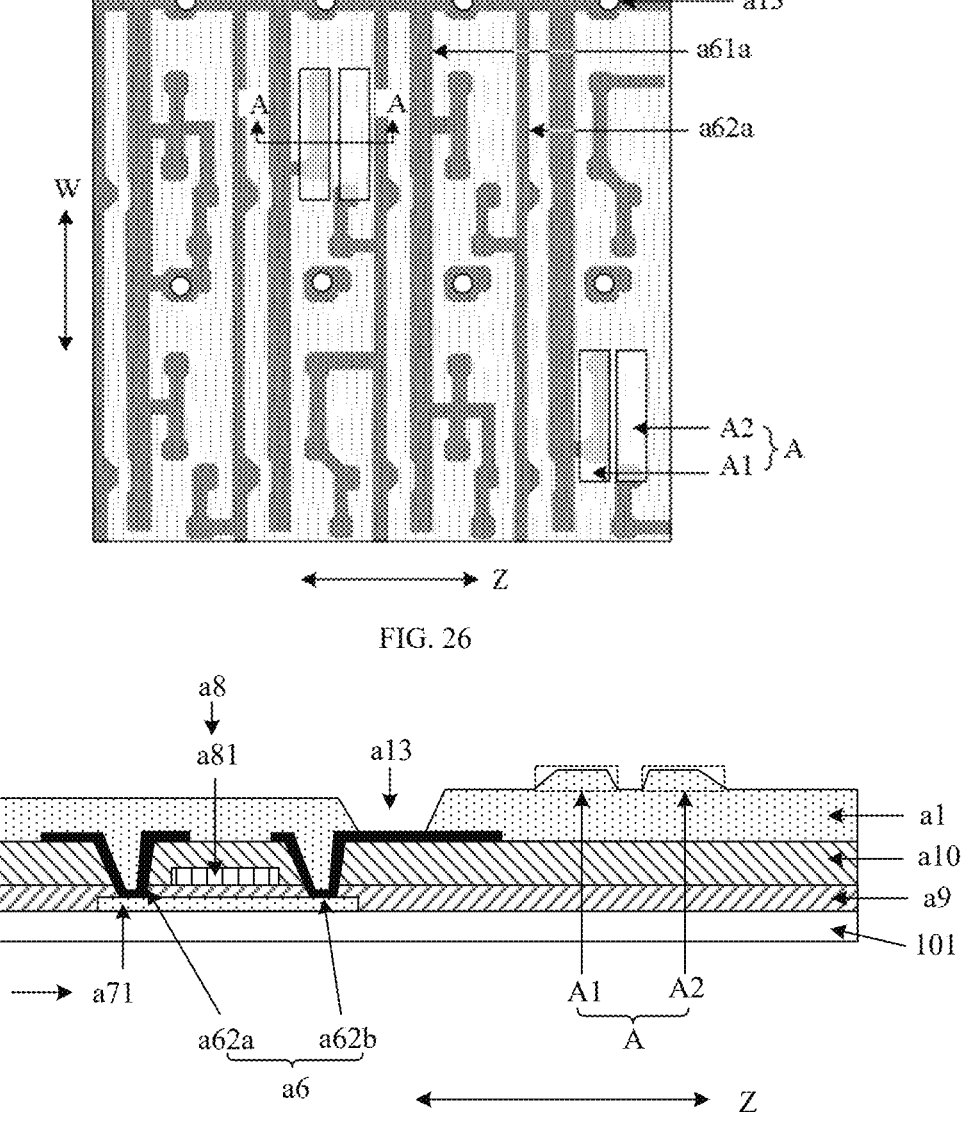
FIG. 26 is a schematic diagram of source and drain layers and planarization layers of a plurality of sub-pixels according to an embodiment of the present disclosure.
FIG. 27 is a sectional view along the AA direction in FIG. 26.

FIG. 24 is a schematic diagram of formation of a planarization layer according to an embodiment of the present application. FIG. 25 is a top view of a planarization layer according to an embodiment of the present disclosure. FIG. 26 is a schematic diagram of source and drain layers and planarization layers of a plurality of sub-pixels according to an embodiment of the present disclosure. FIG. 27 is a sectional view in an AA direction in FIG. 26. Referring to FIG. 24 to FIG. 27, the side, away from the base substrate 101, of the planarization layer a1 is provided with a plurality of protruding structures A, and the orthographic projection of the side, away from the base substrate 101, of each protruding structure A on the base substrate 101 is within the orthographic projection of the side, close to the base substrate 101, of the protruding structure A on the base substrate 101.

Optionally, referring to FIG. 25 to FIG. 27, the protruding structure A in each first target sub-pixel 102*a* may include a first protruding sub-structure A1 and a second protruding sub-structure A2 that are arranged in the first direction Z.

The length of the first protruding sub-structure A1 in the second direction W may be greater than the length of the first protruding sub-structure A1 in the first direction Z. The length of the second protruding sub-structure A2 in the second direction W may be greater than the length of the second protruding sub-structure A2 in the first direction Z. The second direction W may be approximately perpendicular to the first direction Z, and both the first direction Z and the second direction W may be approximately parallel to the bearing surface of the base substrate 101.

Optionally, referring to FIG. 24 to FIG. 27, for each sub-pixel, the planarization layer a1 of the sub-pixel may be provided with a via hole a13. For the first target sub-pixel 102a, the orthographic projection of the via hole a13 in the planarization layer a1 of the first target sub-pixel 102a on the base substrate 101 is separate from the orthographic projection of the protruding structure A on the base substrate 101. The via hole a13 is configured to expose at least a portion of the drain a62b of the first target sub-pixel 102a.

In this embodiment of the present disclosure, the light transmittance of the portion, corresponding to the portion with the protruding structure A in the planarization layer a1, of the halftone mask is different from the light transmittance of the portion, corresponding to the portion other than the protruding structure A in the planarization layer a1, of the halftone mask.

The region where the protruding structure A is disposed may be an unexposed region, the region where the via hole a13 is disposed is a completely exposed region, and the region, other than the regions where the protruding structure A and the via hole a13 are disposed, in the planarization layer a1 is a semi-exposed region.

During manufacture of the planarization layer a1, the angle between the tangent line of the peripheral region a12 of the protruding structure A and the side, close to the base substrate 101, of the protruding structure A and the length, in the third direction X, of the orthographic projection of the peripheral region a12 of the protruding structure A on the base substrate 101 may be controlled by controlling the range of the semi-exposed region.

It should be noted that the third target sub-pixel in the second sub-pixels 103 may also be provided with the protruding structure A. In addition, the maximum size of the protruding structure A of each third target sub-pixel in the direction perpendicular to the bearing surface of the base substrate 101 is smaller than the maximum size of the protruding structure A of any first target sub-pixel 102a in the direction perpendicular to the bearing surface.

In step 2023b, an electrode pattern is formed on a side, away from the base substrate, of the planarization layer.

Figure 28:
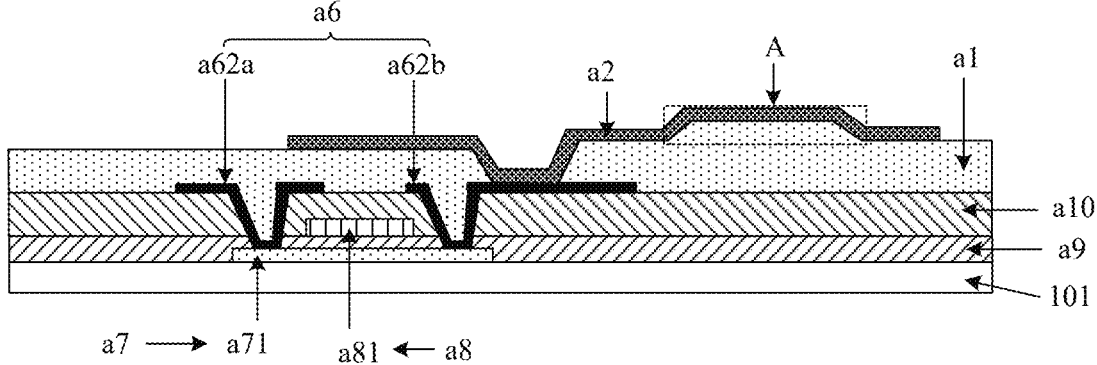
FIG. 28 is a schematic diagram of formation of an electrode pattern according to an embodiment of the present disclosure.
Figure 29:
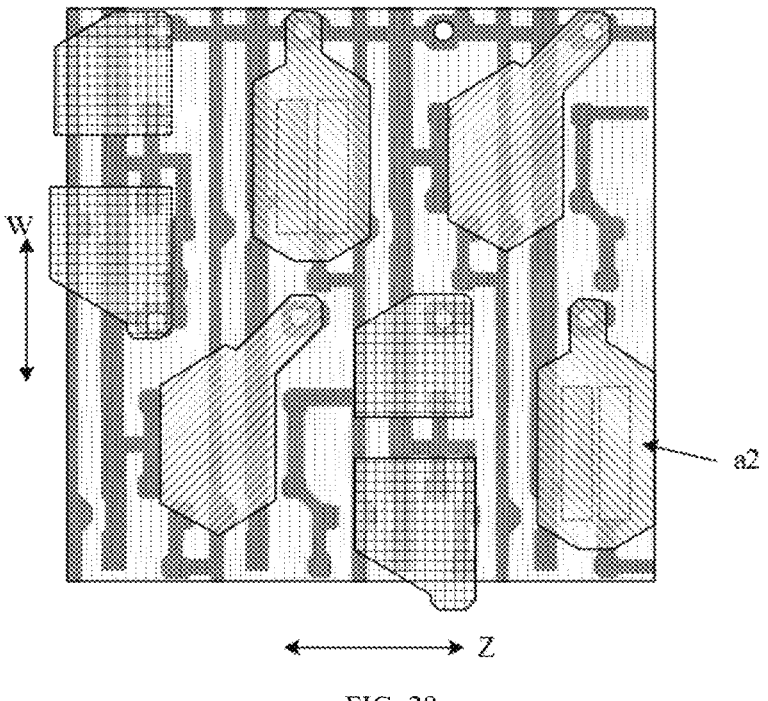
FIG. 29 is a schematic diagram of source and drain layers, planarization layers, and electrode patterns of a plurality of sub-pixels according to an embodiment of the present disclosure.

In this embodiment of the present disclosure, referring to FIG. 28 and FIG. 29, an electrode pattern a2 may be formed on the side, away from the base substrate 101, of the planarization layer a1. A portion of electrode pattern a2 is disposed in the via hole a13, so as to be connected to the drain a62b. In addition, for the sub-pixel which is provided with the protruding structure A in the planarization layer a1, the orthographic projection of electrode pattern a2 of the sub-pixel on the base substrate 101 covers the orthographic projection of the protruding structure A on the base substrate 101.

Referring to FIG. 30, the shape of the electrode pattern of the red sub-pixel, the shape of the electrode pattern of the green sub-pixel, and the shape of the electrode pattern of the blue sub-pixel are different from one another.

In step 2024b, a pixel defining layer is formed on a side, away from the base substrate, of the electrode pattern.

In this embodiment of the present disclosure, referring to FIG. 31, the pixel defining layer a5 may be formed on the side, away from the base substrate 101, of the electrode pattern a2 through a patterning process. The patterning process may include photoresist (PR) coating, exposure, development, etching, photoresist stripping, and the like.

Figure 32:
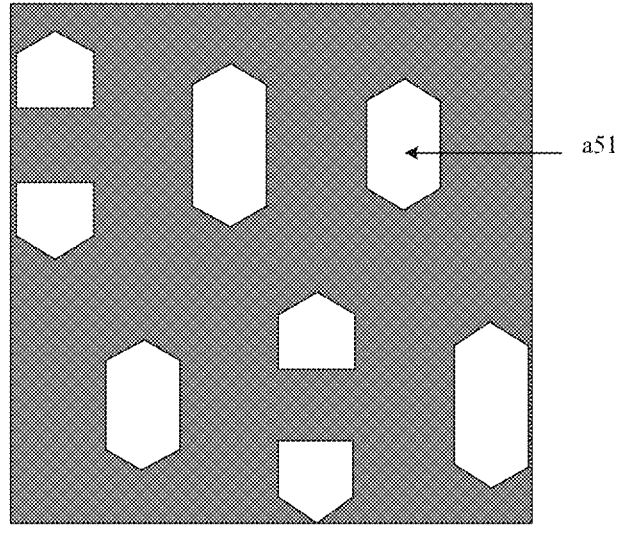
FIG. 32 is a top view of pixel defining layers of a plurality of sub-pixels according to an embodiment of the present disclosure.
Figure 33:
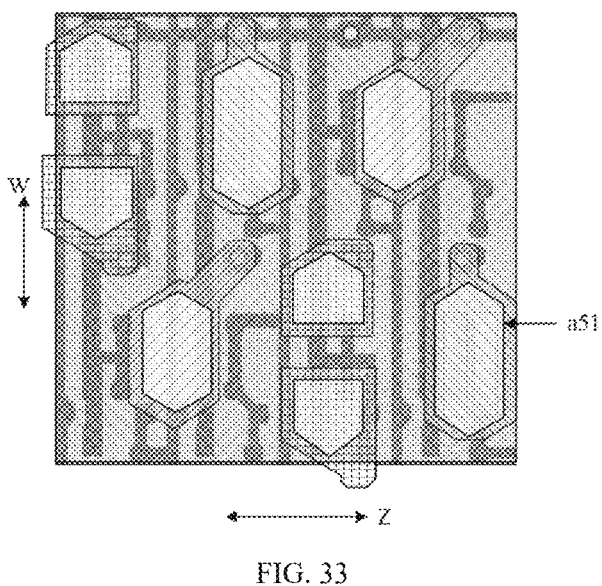
FIG. 33 is a schematic diagram of source and drain layers, planarization layers, electrode patterns, and pixel defining layers of a plurality of sub-pixels according to an embodiment of the present disclosure.

FIG. 32 is a schematic diagram of pixel defining layers of a plurality of sub-pixels according to an embodiment of the present disclosure. Referring to FIG. 32, the pixel defining layer a5 is provided with an opening a51 corresponding to the electrode pattern a2. The opening a51 may be configured to expose at least a portion of the corresponding electrode pattern a2. Referring to FIG. 33, for the first target sub-pixel 102a, the at least portion of the electrode pattern a2 exposed from the opening a51 includes a portion, overlapped with the protruding structure A, of the electrode pattern a2.

In step 2025b, a light-emitting pattern is formed on a side, away from the base substrate, of the pixel defining layer.

Figure 34:
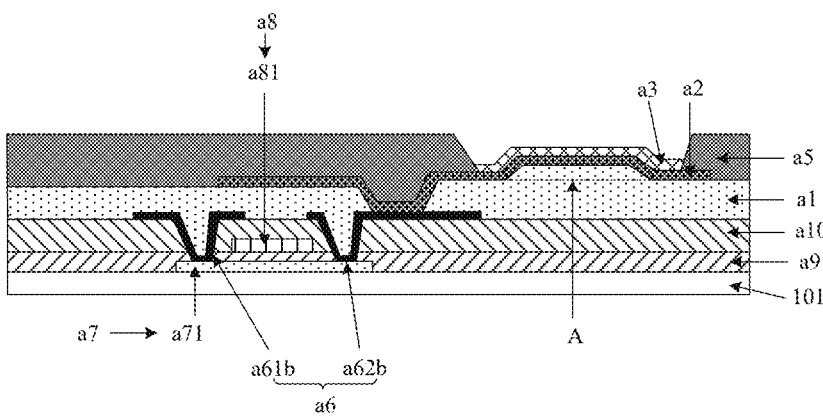
FIG. 34 is a schematic diagram of formation of an electrode pattern according to an embodiment of the present disclosure.

In this embodiment of the present disclosure, referring to FIG. 34, the light-emitting pattern a3 may be formed on the side, away from the base substrate 101, of the pixel defining layer a5. The light-emitting pattern a3 may be disposed in the opening a51 in the pixel defining layer a5, and the light-emitting pattern a3 is in contact with the portion, exposed from the opening a51, of the electrode pattern a2. That is, the side, close to the base substrate 101, of the light-emitting pattern a3 may be in contact with the side, away from the base substrate 101, of the electrode pattern a2.

In step 2026b, an electrode layer is formed on a side, away from the base substrate, of the light-emitting pattern.

In this embodiment of the present disclosure, referring to FIG. 34, the electrode layer a4 may be formed on the side, away from the base substrate 101, of the light-emitting pattern a3. The side, away from the base substrate 101, of the light-emitting pattern a3 is in contact with the side, close to the base substrate 101, of the electrode layer a4.

In addition, for the first target sub-pixel 102a, the orthographic projection of the portion, in contact with both the electrode pattern a2 and the electrode layer a4, of the light-emitting pattern a3 of the first target sub-pixel 102a on the base substrate 101 covers the orthographic projection of the protruding structure A in the first target sub-pixel 102a on the base substrate 101. Because only the portion, in contact with both the electrode pattern a2 and the electrode layer a4, of the light-emitting pattern a3 can emit light normally, by making the orthographic projection of the portion, in contact with both the electrode pattern a2 and the electrode layer a4, of the light-emitting pattern a3 on the base substrate 101 cover the orthographic projection of the protruding structure A on the base substrate 101, it can be ensured that the region where the protruding structure A is disposed in the manufactured display panel can emit light normally.

In summary, this embodiment of the present disclosure provides a method for manufacturing a display panel. In the display panel manufactured by this method, the electrode pattern of the first target sub-pixel is jacked up by the protruding structure in the planarization layer of the first target sub-pixel, and the orthographic projection of the portion, in contact with both the electrode pattern and the electrode layer, of the light-emitting pattern on the base substrate covers the orthographic projection of the protruding structure on the base substrate. Therefore, the region where the protruding structure is disposed in the display panel can emit light normally. In addition, the protruding structure is provided in the planarization layer of the first target sub-pixel, which can ensure that the bending portion of the display panel can emit light normally, thereby avoiding color shift from occurring on images displayed on the side face of the display device. Thus, the display effect of the display device is relatively good.

Figure 35:
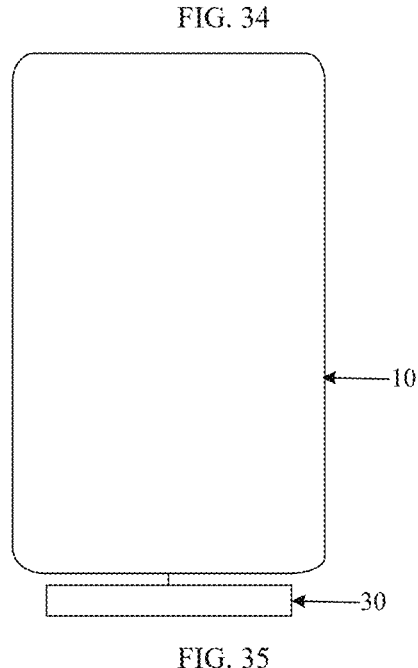
FIG. 35 is a schematic structural diagram of a display device according to an embodiment of the present disclosure.

FIG. 35 is a schematic structural diagram of a display device according to an embodiment of the present disclosure. It can be known from FIG. 35 that the display device may include a power supply assembly 30 and the display panel 10 provided in the foregoing embodiments. The power supply assembly 30 may be configured to supply power to the display panel 10. The display device may be a curved display device.

Optionally, the display device may be any product or component with a display function and a fingerprint recognition function, such as an organic light-emitting diode (OLED) display panel, electronic paper, a mobile phone, a tablet computer, a TV, a monitor, a notebook computer, a digital photo frame, or a navigator.

Described above are merely optional embodiments of the present disclosure, and are not intended to limit the present disclosure. Any modifications, equivalent substitutions, improvements and the like made within the spirit and principles of the present disclosure shall be included within the scope of protection of the present disclosure.

What is claimed is:

1. A display panel, comprising:

a base substrate, provided with a curved display region and a planar display region, wherein the curved display region is configured for curved display; and a plurality of first sub-pixels disposed in the curved display region and a plurality of second sub-pixels disposed in the planar display region, wherein each of the first sub-pixels and the second sub-pixels comprises: a planarization layer, an electrode pattern, a light-emitting pattern, and an electrode layer which are sequentially laminated in a direction going away from the base substrate; wherein the plurality of first sub-pixels comprise at least one first target sub-pixel and at least one second target sub-pixel, wherein the planarization layer of the first target sub-pixel is provided with a protruding structure, and a maximum distance between a side, away from the base substrate, of the planarization layer of the second target sub-pixel and a side, close to the base substrate, of the planarization layer of the second target sub-pixel is smaller than a maximum distance between a side, away from the base substrate, of the planarization layer of the first target sub-pixel and a side, close to the base substrate, of the planarization layer of the first target sub-pixel;

wherein for the first target sub-pixel, an orthographic projection of a portion, in contact with both the electrode pattern and the electrode layer, of the light-emitting pattern of the first target sub-pixel on the base substrate covers an orthographic projection of the protruding structure in the planarization layer of the first target sub-pixel on the base substrate; and wherein each of the sub-pixels further comprises a pixel defining layer disposed on a side, away from the base substrate, of the electrode pattern, the pixel defining layer being provided with an opening, at least a portion of the light-emitting pattern of the sub-pixel being disposed in the opening; wherein a slope angle of the opening in the pixel defining layer of each first target sub-pixel is smaller than a slope angle of the opening in the pixel defining layer of any second target sub-pixel;

wherein the slope angle of the opening in the pixel defining layer is an angle between a side face of the opening in the pixel defining layer and a side, close to the base substrate, of the pixel defining layer.

2. The display panel according to claim 1, wherein the display panel meets at least one of the following requirements:

a color of light emitted from the at least one first target sub-pixel is different from a color of light emitted from the at least one second target sub-pixel; and the at least one first target sub-pixel comprises a blue sub-pixel, and the at least one second target sub-pixel comprises at least one of a red sub-pixel and a green sub-pixel;

or the planarization layer of each of the sub-pixels is provided with a via hole; wherein for each first target sub-pixel, an orthographic projection of the via hole on the base substrate is separate from the orthographic projection of the protruding structure on the base substrate.

3. The display panel according to claim 1, wherein the at least one first target sub-pixel comprises a blue sub-pixel, a red sub-pixel, and a green sub-pixel; and the protruding structure in the planarization layer of each first target sub-pixel is provided with a central region and a peripheral region;

wherein in a first plane perpendicular to a bearing surface of the base substrate, a first angle between a tangent line of the peripheral region of the protruding structure in the blue sub-pixel and a side, close to the base substrate, of the protruding structure is greater than or equal to a second angle between a tangent line of the peripheral region of the protruding structure in the red sub-pixel and a side, close to the base substrate, of the protruding structure.

4. The display panel according to claim 3, wherein the first angle is greater than or equal to a third angle between a tangent line of the peripheral region of the protruding structure in the green sub-pixel and a side, close to the base substrate, of the protruding structure.

5. The display panel according to claim 4, wherein the first angle is greater than or equal to 5° and smaller than or equal to 40°.

6. The display panel according to claim 5, wherein the display panel meets at least one of the following requirements:

the second angle and the third angle are both greater than or equal to 0° and smaller than or equal to 40°;

or the first angle ranges from 8° to 12°.

7. The display panel according to claim 1, wherein the slope angle of the opening in the pixel defining layer of a blue sub-pixel in the display panel is smaller than the slope angle of the opening in the pixel defining layer of a red sub-pixel in the display panel, and smaller than the slope angle of the opening in the pixel defining layer of a green sub-pixel in the display panel.

8. The display panel according to claim 1, wherein the protruding structure in each first target sub-pixel comprises a first protruding sub-structure and a second protruding sub-structure which are arranged in a first direction; wherein a length of the first protruding sub-structure in a second direction is greater than a length of the first protruding sub-structure in a first direction; and a length of the second protruding sub-structure in the second direction is greater than a length of the second protruding sub-structure in the first direction, wherein the second direction is approximately perpendicular to the first direction, and the first direction and the second direction are both approximately parallel to a bearing surface of the base substrate.

9. The display panel according to claim 8, wherein the length of the first protruding sub-structure in the first direction is approximately equal to the length of the second protruding sub-structure in the first direction; and the length of the first protruding sub-structure in the second direction is approximately equal to the length of the second protruding sub-structure in the second direction.

10. The display panel according to claim 9, wherein a light-emitting region of each first target sub-pixel comprises a symmetry axis extending in the second direction; wherein an orthographic projection of the first protruding substructure on the base substrate and an orthographic projection of the second protruding sub-structure on the base substrate are approximately symmetric about an orthographic projection of the symmetry axis on the base substrate.

11. The display panel according to claim 1, wherein each of the sub-pixels further comprises a source and drain layer disposed on a side, close to the base substrate, of the planarization layer, the source and drain layer comprising a source and drain metal pattern; wherein an orthographic projection of the protruding structure in each first target sub-pixel on the base substrate is at least partially overlapped with an orthographic projection of the source and drain metal pattern on the base substrate.

12. The display panel according to claim 11, wherein the source and drain metal pattern comprises a first pattern and a second pattern; wherein a length of the first pattern in a second direction is greater than a length of the first pattern in a first direction; and a length of the second pattern in the second direction is greater than a length of the second pattern in the first direction; wherein the second direction is approximately perpendicular to the first direction, and both the first direction and the second direction are approximately parallel to a bearing surface of the base substrate; and for the electrode pattern in each first target sub-pixel, a length of the electrode pattern in the second direction is greater than a length of the electrode pattern in the first direction, and the electrode pattern comprises a first edge portion and a second edge portion that are arranged in the first direction; wherein an orthographic projection of the first edge portion on the base substrate is overlapped with an orthographic projection of the first pattern on the base substrate; and an orthographic projection of the second edge portion on the base substrate is overlapped with an orthographic projection of the second pattern on the base substrate.

13. The display panel according to claim 1, wherein a ratio of a maximum size of the protruding structure in each first target sub-pixel in a second plane to a maximum size of the protruding structure in a direction perpendicular to a bearing surface of the base substrate is greater than or equal to 5 and smaller than or equal to 20;

wherein the second plane is approximately parallel to the bearing surface.

14. The display panel according to claim 1, wherein the plurality of second sub-pixels comprise at least one third target sub-pixel and at least one fourth target sub-pixel; wherein the planarization layer of the third target sub-pixel is provided with a protruding structure; and a maximum distance between a side, away from the base substrate, of the planarization layer of the fourth target sub-pixel and a side, close to the base substrate, of the planarization layer of the fourth target sub-pixel is smaller than a maximum distance between a side, away from the base substrate, of the planarization layer of the third target sub-pixel and a side, close to the base substrate, of the planarization layer of the third target sub-pixel.

15. The display panel according to claim 14, wherein a maximum size of the protruding structure of each third target sub-pixel in a direction perpendicular to a bearing surface of the base substrate is smaller than a maximum size of the protruding structure of any first target sub-pixel in the direction perpendicular to the bearing surface.

16. A method for manufacturing a display panel, comprising:

forming a plurality of first sub-pixels in a curved display region of a base substrate, and forming a plurality of second sub-pixels in a planar display region of the base substrate, the curved display region being configured for curved display;

wherein forming the first sub-pixels and the second subpixels respectively comprises: sequentially forming a planarization layer, an electrode pattern, a light-emitting pattern, and an electrode layer in a direction going away from the base substrate; wherein the plurality of first sub-pixels comprise at least one first target sub-pixel and at least one second target subpixel, wherein the planarization layer of the first target sub-pixel is provided with a protruding structure, and a maximum distance between a side, away from the base substrate, of the planarization layer of the second target sub-pixel and a side, close to the base substrate, of the planarization layer of the second target sub-pixel is smaller than a maximum distance between a side, away from the base substrate, of the planarization layer of the first target sub-pixel and a side, close to the base substrate, of the planarization layer of the first target sub-pixel;

wherein for the first target sub-pixel, an orthographic projection of a portion, in contact with both the electrode pattern and the electrode layer, of the lightemitting pattern of the first target sub-pixel on the base substrate covers an orthographic projection of the protruding structure in the planarization layer of the first target sub-pixel on the base substrate; and wherein each of the sub-pixels further comprises a pixel defining layer disposed on a side, away from the base substrate, of the electrode pattern, the pixel defining layer being provided with an opening, at least a portion of the light-emitting pattern of the sub-pixel being disposed in the opening; wherein a slope angle of the opening in the pixel defining layer of each first target sub-pixel is smaller than a slope angle of the opening in the pixel defining layer of any second target sub-pixel;

wherein the slope angle of the opening in the pixel defining layer is an angle between a side face of the opening in the pixel defining layer and a side, close to the base substrate, of the pixel defining layer.

17. The method according to claim 16, wherein forming the planarization layer of the first target sub-pixel on a side of the base substrate comprises:

forming a planarization film layer on the side of the base substrate;

coating photoresist;

exposing the photoresist by using a halftone mask;

performing development on the photoresist; and acquiring the planarization layer by etching the planarization film layer;

wherein light transmittance of a portion, corresponding to a portion with the protruding structure of the planarization layer, of the halftone mask is different from light transmittance of a portion, corresponding to a portion other than the protruding structure of the planarization layer, of the halftone mask.

18. The method according to claim 16, wherein a color of light emitted from the at least one first target sub-pixel is different from a color of light emitted from the at least one second target sub-pixel; and the at least one first target sub-pixel comprises a blue sub-pixel, and the at least one second target sub-pixel comprises at least one of a red sub-pixel and a green sub-pixel.

19. A display device, comprising a power supply assembly and a display panel, wherein the power supply assembly is configured to supply power to the display panel, and the display panel comprises:

a base substrate, provided with a curved display region and a planar display region, wherein the curved display region is configured for curved display; and a plurality of first sub-pixels disposed in the curved display region and a plurality of second sub-pixels disposed in the planar display region, wherein each of the first sub-pixels and the second sub-pixels comprises: a planarization layer, an electrode pattern, a light-emitting pattern, and an electrode layer which are sequentially laminated in a direction going away from the base substrate; wherein the plurality of first sub-pixels comprise at least one first target sub-pixel and at least one second target subpixel, wherein the planarization layer of the first target sub-pixel is provided with a protruding structure, and a maximum distance between a side, away from the base substrate, of the planarization layer of the second target sub-pixel and a side, close to the base substrate, of the planarization layer of the second target sub-pixel is smaller than a maximum distance between a side, away from the base substrate, of the planarization layer of the first target sub-pixel and a side, close to the base substrate, of the planarization layer of the first target sub-pixel;

wherein for the first target sub-pixel, an orthographic projection of a portion, in contact with both the electrode pattern and the electrode layer, of the light-emitting pattern of the first target sub-pixel on the base substrate covers an orthographic projection of the protruding structure in the planarization layer of the first target sub-pixel on the base substrate; and wherein each of the sub-pixels further comprises a pixel defining layer disposed on a side, away from the base substrate, of the electrode pattern, the pixel defining layer being provided with an opening, at least a portion of the light-emitting pattern of the sub-pixel being disposed in the opening; wherein a slope angle of the opening in the pixel defining layer of each first target sub-pixel is smaller than a slope angle of the opening in the pixel defining layer of any second target sub-pixel;

wherein the slope angle of the opening in the pixel defining layer is an angle between a side face of the opening in the pixel defining layer and a side, close to the base substrate, of the pixel defining layer.

\* \* \* \* \*